(12) United States Patent
Kim et al.

(10) Patent No.: US 12,242,293 B2
(45) Date of Patent: Mar. 4, 2025

(54) LOW-NOISE HIGH EFFICIENCY BIAS GENERATION CIRCUITS AND METHOD

(71) Applicant: pSemi Corporation, San Diego, CA (US)

(72) Inventors: Tae Youn Kim, Irvine, CA (US); Robert Mark Englekirk, Littleton, CO (US)

(73) Assignee: pSemi Corporation, San Diego, CA (US)

( * ) Notice: Subject to any disclaimer, the term of this patent is extended or adjusted under 35 U.S.C. 154(b) by 100 days.

(21) Appl. No.: 18/322,181

(22) Filed: May 23, 2023

(65) Prior Publication Data

US 2023/0384811 A1    Nov. 30, 2023

Related U.S. Application Data

(63) Continuation of application No. 17/530,290, filed on Nov. 18, 2021, now Pat. No. 11,662,755, which is a
(Continued)

(51) Int. Cl.
| G05F 1/56 | (2006.01) |
| G05F 1/46 | (2006.01) |
| H03F 1/30 | (2006.01) |

(52) U.S. Cl.
CPC ............... *G05F 1/56* (2013.01); *G05F 1/468* (2013.01); *H03F 1/303* (2013.01)

(58) Field of Classification Search
CPC .............. G05F 1/56; G05F 1/468; H03F 1/46; H03F 1/56; H03F 1/303; H03F 1/468;
(Continued)

(56) References Cited

U.S. PATENT DOCUMENTS

| 3,995,228 A | 11/1976 | Pass |
| 4,158,182 A | 6/1979 | Washburn |

(Continued)

FOREIGN PATENT DOCUMENTS

| DE | 102005039138 | 2/2007 |
| EP | A-0 938 094 | 8/1999 |

(Continued)

OTHER PUBLICATIONS

Mehari, Yemane, Notice of Allowance received from the USPTO dated Jan. 20, 2023 for U.S. Appl. No. 17/530,290, 52 pgs.

(Continued)

*Primary Examiner* — Yemane Mehari
(74) *Attorney, Agent, or Firm* — Haynes and Boone, LLP

(57) ABSTRACT

An apparatus for generating a steady state positive voltage (PVS) signal and a steady state negative voltage (NVS) signal is presented. The apparatus includes a bias signal generation module for generating a steady state reference voltage signal (RVS) based on a varying supply voltage signal (VDD), the RVS having a voltage level less than the PVS. The apparatus further includes a positive signal generation module (PSGM) generating the PVS, the PSGM including a first capacitor, the PSGM employing the first capacitor to generate a portion of the PVS based on the RVS. The apparatus further includes a negative signal generation module (NSGM) generating the NVS, the NSGM including a second capacitor, the NSGM employing the second capacitor to generate a portion of the NVS based on the RVS.

28 Claims, 20 Drawing Sheets

Related U.S. Application Data continuation of application No. 16/744,027, filed on Jan. 15, 2020, now Pat. No. 11,188,106, which is a continuation of application No. 16/143,142, filed on Sep. 26, 2018, now Pat. No. 10,571,940, which is a continuation of application No. 15/688,597, filed on Aug. 28, 2017, now Pat. No. 10,114,391, which is a continuation of application No. 15/059,206, filed on Mar. 2, 2016, now Pat. No. 9,778,669, which is a continuation of application No. 14/462,193, filed on Aug. 18, 2014, now Pat. No. 9,429,969, which is a continuation of application No. 13/016,875, filed on Jan. 28, 2011, now Pat. No. 8,816,659.

(60) Provisional application No. 61/372,086, filed on Aug. 9, 2010, provisional application No. 61/371,652, filed on Aug. 6, 2010.

(58) Field of Classification Search
CPC ......... H03F 1/575; H02M 3/07; H02M 3/073; H02M 3/156; H02M 3/1588
USPC ........ 363/59, 62, 63; 323/269–282, 311–317
See application file for complete search history.

(56) References Cited

U.S. PATENT DOCUMENTS

| | | | |
|---|---|---|---|
| 4,374,357 A | 2/1983 | Olesin et al. | |
| 4,388,537 A | 6/1983 | Kanuma | |
| 4,575,644 A | 3/1986 | Leslie | |
| 4,797,899 A | 1/1989 | Fuller et al. | |
| 5,036,229 A | 7/1991 | Tran | |
| 5,093,586 A | 3/1992 | Asari | |
| 5,124,571 A | 6/1992 | Gillingham et al. | |
| 5,180,928 A | 1/1993 | Choi | |
| 5,196,996 A | 3/1993 | Oh | |
| 5,216,588 A | 6/1993 | Bajwa et al. | |
| 5,227,675 A | 7/1993 | Taguchi | |
| 5,392,205 A | 2/1995 | Zavaleta | |
| 5,394,372 A | 2/1995 | Tanaka et al. | |
| 5,418,499 A | 5/1995 | Nakao | |
| 5,446,418 A | 8/1995 | Hara et al. | |
| 5,483,195 A | 1/1996 | Brown | |
| 5,483,434 A | 1/1996 | Seesink | |
| 5,528,245 A | 6/1996 | Aker et al. | |
| 5,546,031 A | 8/1996 | Seesink | |
| 5,600,281 A | 2/1997 | Mori et al. | |
| 5,677,650 A | 10/1997 | Kwasniewski et al. | |
| 5,689,213 A | 11/1997 | Sher | |
| 5,734,291 A | 3/1998 | Tasdighi et al. | |
| 5,774,404 A | 6/1998 | Eto | |
| 5,818,766 A | 10/1998 | Song | |
| 5,878,331 A | 3/1999 | Yamamoto et al. | |
| 5,969,988 A | 10/1999 | Tanzawa et al. | |
| 5,986,649 A | 11/1999 | Yamazaki | |
| 6,020,781 A | 2/2000 | Fujioka | |
| 6,034,562 A | 3/2000 | Bonet et al. | |
| 6,087,968 A | 7/2000 | Roza | |
| 6,094,103 A | 7/2000 | Jeong et al. | |
| 6,107,862 A | 8/2000 | Mukainakano et al. | |
| 6,218,904 B1 | 4/2001 | Panther | |
| 6,223,990 B1 | 5/2001 | Kamei | |
| 6,226,206 B1 | 5/2001 | Maeda | |
| 6,275,096 B1 | 8/2001 | Hsu et al. | |
| 6,308,047 B1 | 10/2001 | Yamamoto et al. | |
| 6,310,789 B1 | 10/2001 | Nebrigic et al. | |
| 6,339,349 B1 | 1/2002 | Rajagopalan | |
| 6,370,046 B1 | 4/2002 | Nebrigic et al. | |
| 6,400,211 B1 | 6/2002 | Yokomizo et al. | |
| 6,424,585 B1 | 7/2002 | Doishi | |
| 6,429,730 B2 | 8/2002 | Houghton et al. | |
| 6,429,732 B1* | 8/2002 | Tedrow ................. | G11C 16/30 |
| | | | 327/536 |
| 6,535,071 B2 | 3/2003 | Forbes | |
| 6,560,164 B2 | 5/2003 | Kawai et al. | |
| 6,617,933 B2 | 9/2003 | Ito et al. | |
| 6,661,683 B2 | 12/2003 | Botker et al. | |
| 6,664,861 B2 | 12/2003 | Murakami | |
| 6,737,926 B2 | 5/2004 | Forbes | |
| 6,784,737 B2 | 8/2004 | Martin et al. | |
| 6,794,927 B2 | 9/2004 | Bedarida et al. | |
| 6,809,603 B1 | 10/2004 | Ho | |
| 6,812,775 B2* | 11/2004 | Seo ...................... | H02M 3/073 |
| | | | 327/536 |
| 6,822,884 B1 | 11/2004 | Rosenthal et al. | |
| 6,897,708 B2 | 5/2005 | Hamasako | |
| 6,968,020 B1 | 11/2005 | Jayaraman | |
| 7,068,114 B2 | 6/2006 | Nishiyama | |
| 7,102,449 B1 | 9/2006 | Mohan | |
| 7,126,595 B2 | 10/2006 | Yanagi et al. | |
| 7,129,796 B2 | 10/2006 | Goto | |
| 7,180,794 B2 | 2/2007 | Matsue | |
| 7,256,642 B2 | 8/2007 | Kimura | |
| 7,332,966 B2 | 2/2008 | Furuya et al. | |
| 7,345,547 B2 | 3/2008 | Wang et al. | |
| 7,382,176 B2 | 6/2008 | Ayres et al. | |
| 7,532,061 B2 | 5/2009 | Ragone et al. | |
| 7,545,684 B2 | 6/2009 | Nakagawa et al. | |
| 7,560,977 B2 | 7/2009 | Miyazaki et al. | |
| 7,570,104 B2 | 8/2009 | Hsu | |
| 7,649,403 B2 | 1/2010 | Lee et al. | |
| 7,667,529 B2 | 2/2010 | Consuelo et al. | |
| 7,724,070 B2 | 5/2010 | Fukami | |
| 7,724,072 B2 | 5/2010 | Baek et al. | |
| 7,728,663 B2 | 6/2010 | Rabjohn et al. | |
| 7,864,970 B2 | 1/2011 | Niwa et al. | |
| 7,928,796 B2 | 4/2011 | Namekawa | |
| 7,944,277 B1 | 5/2011 | Sinitsky et al. | |
| 7,956,675 B2 | 6/2011 | Saitoh et al. | |
| 8,008,970 B1 | 8/2011 | Homol et al. | |
| 8,040,175 B2 | 10/2011 | Raghavan | |
| 8,067,977 B2 | 11/2011 | Joo | |
| 8,072,258 B2 | 12/2011 | Yamahira | |
| 8,339,185 B2 | 12/2012 | Cazzaniga et al. | |
| 8,378,736 B2 | 2/2013 | Burgener et al. | |
| 8,519,780 B1 | 8/2013 | Vilas Boas et al. | |
| 8,629,935 B2 | 1/2014 | Kikuchi et al. | |
| 8,686,787 B2 | 4/2014 | Swonger | |
| 8,816,659 B2 | 8/2014 | Kim et al. | |
| 8,994,452 B2 | 3/2015 | Kim et al. | |
| 8,995,154 B2* | 3/2015 | Kaneda ................. | G11C 5/147 |
| | | | 363/60 |
| 9,030,248 B2 | 5/2015 | Kim et al. | |
| 9,154,027 B2 | 10/2015 | Huynh et al. | |
| 9,190,902 B2 | 11/2015 | Burgener et al. | |
| 9,264,053 B2 | 2/2016 | Englekirk | |
| 9,354,654 B2 | 5/2016 | Swonger | |
| 9,413,362 B2 | 8/2016 | Englekirk | |
| 9,429,969 B2* | 8/2016 | Kim ....................... | G05F 1/56 |
| 9,584,133 B2 | 2/2017 | Ktatyuk et al. | |
| 9,660,590 B2 | 5/2017 | Kim et al. | |
| 9,685,963 B2 | 6/2017 | Englekirk | |
| 9,778,669 B2 | 10/2017 | Kim et al. | |
| 9,998,002 B2 | 6/2018 | Englekirk | |
| 10,114,391 B2 | 10/2018 | Kim et al. | |
| 10,148,255 B2 | 12/2018 | Burgener et al. | |
| 10,250,131 B2 | 4/2019 | Kim et al. | |
| 10,571,940 B2 | 2/2020 | Kim et al. | |
| 10,971,996 B2* | 4/2021 | Hunt-Schroeder ..... | G05F 3/205 |
| 11,188,106 B2 | 11/2021 | Kim et al. | |
| 11,662,755 B2 | 5/2023 | Kim et al. | |
| 2002/0140412 A1 | 10/2002 | Maneatis | |
| 2002/0153940 A1 | 10/2002 | Wurcer et al. | |
| 2003/0034849 A1 | 2/2003 | Sanduleanu et al. | |
| 2005/0052220 A1 | 3/2005 | Burgener et al. | |
| 2006/0114731 A1 | 6/2006 | Park et al. | |
| 2006/0284670 A1 | 12/2006 | Eid et al. | |
| 2007/0069801 A1 | 3/2007 | Ragone et al. | |
| 2007/0146064 A1 | 6/2007 | Takashi et al. | |
| 2008/0007980 A1 | 1/2008 | Fujiwara | |
| 2008/0030237 A1 | 2/2008 | Danioni et al. | |
| 2008/0044041 A1 | 2/2008 | Tucker et al. | |
| 2008/0079509 A1 | 4/2008 | Serrano et al. | |

(56) References Cited

U.S. PATENT DOCUMENTS

| | | |
|---|---|---|
| 2008/0116979 A1 | 5/2008 | Lesso et al. |
| 2008/0158915 A1 | 7/2008 | Williams |
| 2008/0272833 A1 | 11/2008 | Ivanov et al. |
| 2008/0272845 A1 | 11/2008 | Willassen et al. |
| 2008/0298605 A1 | 12/2008 | Fan et al. |
| 2009/0140795 A1 | 6/2009 | Choy |
| 2010/0026542 A1 | 2/2010 | Wang et al. |
| 2010/0060343 A1 | 3/2010 | Saithoh et al. |
| 2010/0110736 A1 | 5/2010 | Gronthal et al. |
| 2010/0194471 A1 | 8/2010 | Raghunathan et al. |
| 2010/0245327 A1 | 9/2010 | Tsujino et al. |
| 2010/0295626 A1 | 11/2010 | Kim et al. |
| 2011/0156819 A1 | 6/2011 | Kim et al. |
| 2012/0038344 A1 | 2/2012 | Kim et al. |
| 2013/0148456 A1 | 6/2013 | Cho et al. |
| 2013/0320955 A1 | 12/2013 | Kratyuk et al. |
| 2014/0055194 A1 | 2/2014 | Burgener et al. |
| 2015/0002195 A1 | 1/2015 | Englekirk |
| 2015/0002214 A1 | 1/2015 | Englekirk |
| 2015/0084610 A1 | 3/2015 | Kim et al. |
| 2016/0126835 A1 | 5/2016 | Englekirk |
| 2016/0179114 A1 | 6/2016 | Kim et al. |
| 2016/0191022 A1 | 6/2016 | Burgener et al. |
| 2016/0285363 A1 | 9/2016 | Englekirk |
| 2017/0098996 A1 | 4/2017 | Englekirk |
| 2018/0046210 A1 | 2/2018 | Kim et al. |
| 2018/0091045 A1 | 3/2018 | Englekirk |
| 2019/0025863 A1 | 1/2019 | Kim et al. |
| 2019/0097612 A1 | 3/2019 | Burgener et al. |
| 2020/0225688 A1 | 7/2020 | Kim et al. |
| 2022/0221886 A1 | 7/2022 | Kim et al. |

FOREIGN PATENT DOCUMENTS

| | | |
|---|---|---|
| EP | 2421132 A2 | 2/2012 |
| EP | 1664966 | 7/2014 |
| EP | 2830203 | 1/2015 |
| GB | 2451524 | 2/2009 |
| JP | 04-334105 | 11/1992 |
| JP | 05-111241 | 4/1993 |
| JP | 06-152334 | 5/1994 |
| JP | 2000-166220 | 6/2000 |
| JP | 2001-51758 | 2/2001 |
| JP | 2001-119927 | 4/2001 |
| JP | 2002-119053 | 4/2002 |
| JP | 2005057860 | 3/2005 |
| JP | 2006-352326 | 12/2006 |
| JP | 5675529 | 1/2015 |
| WO | WO98/58382 | 12/1998 |
| WO | 2009/063661 A1 | 5/2009 |
| WO | 2010/008586 A2 | 1/2010 |

OTHER PUBLICATIONS

Young, Lee W., International Search Report and Written Opinion received from USRO dated Mar. 14, 2011 for appln. No. PCT/US2009/004149, 25 pages.
Peregrine Semiconductor Corporation, photocopy of an Article 19 Amendment Under Section 205(b) and Rule 46.5(b) PCT and clean copy of claims for appln. No. PCT/US2009/004149 dated May 13, 2011, 17 pages.
European Patent Office, photocopy of Communication Pursuant to Rules 161(2) and 162 EPC received from the EPO for appln. No. 09798318.3 dated May 19, 2011, 2 pgs.
Imbernon, Lisa, Communication Pursuant to Article 94(3) EPC received from the EPO for appln. No. 04 816 848.8-1242, dated May 18, 2011, 5 pgs.
Englund, Terry Lee, Office Action received from the USPTO dated Aug. 18, 2011 for U.S. Appl. No. 12/799,583, 47 pgs.
Sircus, Brian, Notification of Transmittal of International Preliminary Report on Patentability dated Aug. 10, 2011 for application No. PCT/US2009/04149, 17 pgs.
European Patent Office, Invitation pursuant to Rule 63(1) EPC dated Aug. 19, 2011 for appln. No. 11154275.9, 3 pgs.
Kurzbauer, Werner, Extended European Search Report dated Dec. 6, 2011 for appln. No. 11175503.9-2215, 4 pgs.
Fedi, Giulio, Extended Search Report received from the EPO dated Mar. 5, 2012 for appln. No. 11154277.5, 8 pgs.
Adams, W.J., et al., "OTA Extended Adjustment Range and Linearization via Programmable Current Mirrors", Circuits and Systems, 1991, Proceedings of the 34th Midwest Symposium on Monterey, CA, USA, May 14-17, 1991.
Bogdan, Pankiewicz, et al., "A Field Programmable Analog Array for CMOS Continuous-Time OTA-C Filter Applications", IEEE Journal of Solid-State Circuits, IEEE Service Center, Piscataway, NJ, USA, vol. 37, No. 2, Feb. 1, 2002.
Jader, et al., "A Linearly Tunable Low-Voltage CMOS Transconductor with Improved Common-Mode Stability and its Application to gm-C Filters", IEEE Transactions on Circuits and Systems II: Analog and Digitalsignal Processing/ISSN 1057-7130, Institute of Electrical and Electronics Engineers Inc., vol. 48, No. 7, Jul. 1, 2001.
Peregrine Semiconductor Corporation, Response filed in the EPO dated Mar. 5, 2012 for appln. No. 11175503.9, 10 pgs.
Englund, Terry Lee, Office Action received from the USPTO dated Apr. 20, 2012 for U.S. Appl. No. 12/799,583, 20 pgs.
Burgener, et al., Amendment filed in the USPTO dated Jun. 19, 2012 for U.S. Appl. No. 12/799,583, 3 pgs.
Peregrine Semiconductor Corporation, Communication under Rule 71(3) EPC received from the EPO dated May 23, 2012 for appln. No. 11175503.9, 60 pgs.
Englund, Terry Lee, Notice of Allowance received from the USPTO dated Jul. 5, 2012 for U.S. Appl. No. 12/799,583, 8 pgs.
Ohyama. Hirohito, Translation of Office Action of Japan Patent Office received from the JPO dated Aug. 7, 2012 for appln. No. 2010-040443, 1 pg.
Peregrine Semiconductor Corporation, Response filed in the EPO dated Oct. 2, 2012 for appln. No. 11154277.5, 14 pgs.
Englund, Terry, Notice of Allowance received from the USPTO dated Oct. 12, 2012 for U.S. Appl. No. 12/799,583.
Nguyen, Hieu P., Office Action received from the USPTO dated Nov. 14, 2012 for U.S. Appl. No. 13/054,781, 5 pgs.
Wells, Kenneth B., Office Action received from the USPTO dated Dec. 26, 2012 for U.S. Appl. No. 13/105,743, 6 pgs.
Swonger, et al., Response filed in the USPTO dated Jan. 28, 2013 for U.S. Appl. No. 13/105,743, 7 pgs.
Yamamoto, et al., "A 2.2-V Operation, 2.4-GHz Single-Chip GaAs MMIC Transceiver for Wireless Applications", IEEE Journal of Solid-State Circuits, vol. 34, No. 4, Apr. 1999, pp. 502-512.
Wells, Kenneth, Office Action received from the USPTO dated Feb. 13, 2013 for U.S. Appl. No. 13/105,743, 55 pgs.
Kim, et al., Amendment—Response to Restriction filed in the USPTO dated Apr. 15, 2013 for U.S. Appl. No. 13/054,781, 5 pgs.
Swonger, James, Response to Office Action filed in USPTO on Jun. 12, 2013 for U.S. Appl. No. 13/105,743, 21 pgs.
Nguyen, Hieu P., Office Action received from USPTO dated Jun. 11, 2013 for appin. no. U.S. Appl. No. 13/054,781, 45 pgs.
Tokuda, Kenji, Japanese Office Action and English Summary received from the JPO dated Jul. 13, 2013 for appln. No. 2011-518737, 10 pgs.
Sasaki, Satoshi, English summary of Office Action for Japanese Patent Office dated Jul. 23, 2013 for appin. No. 2011-171908, 2 pgs.
Kim, et al., Response filed in the USPTO dated Oct. 11, 2013 for U.S. Appl. No. 13/054,781, 13 pgs.
Wells, Kenneth, Notice of Allowance received from the USPTO dated Jul. 24, 2013 for U.S. Appl. No. 13/105,743, 10 pgs.
Meulemans, Bart, Extended Search Report received from the EPO dated Oct. 22, 2013 for appln. No. 11154275.9, 6 pgs.
Wells, Kenneth, Notice of Allowance received from the USPTO dated Nov. 7, 2013 for U.S. Appl. No. 13/105,743, 11 pgs.
Le, Dinh Thanh, Notice of Allowance received from the USPTO dated Nov. 7, 2013 for U.S. Appl. No. 12/460,442, 16 pgs.
Englund, Terry Lee, Office Action received from USPTO on Dec. 6, 2013 for U.S. Appl. No. 13/769,780, 18 pgs.

(56) References Cited

OTHER PUBLICATIONS

European Patent Office, Communication under Rule 71(3) EPC, Intention To Grant received from the EPO dated Nov. 14, 2013 for appln. No. 04816848.8-1809, 43 pgs.
Euopean Patent Office, Office Communication received from the EPO dated Nov. 25, 2013 for appln. No. 11154275.9-1805, 2 pgs.
Meulemans, Bart, Supplementary Search Report received from the EPO dated Jan. 22, 2014 for appln. No. EP09798318, 6 pgs.
Moon, et al., "Design of a Low-Distortion 22-kHz Fifth-Order Bessel Filter", IEEE Journal of Solid-State Circuits, vol. 28, No. 12, Dec. 1993, pp. 1254-1263.
Japanese Patent Office, English translation of Office Action received from the JPO dated Feb. 4, 2014 for appln. No. 2012-243547, 2 pgs.
Peregrine Semiconductor Corporation, Response filed in the EPO dated Jan. 8, 2014 for appln. No. 04816848.8, 13 pgs.
European Patent Office, Communication pursuant to Rules 70(2) and 70a(2) EPC dated Feb. 14, 2014 for appln. No. 09798318.3, 1 pg.
Gundlach, Susanne, Communication under Rule 71(3) EPC received from the EPO dated Feb. 14, 2014 for appln. No. 04816848.8, 44 pgs.
Sakurada, Masaki, Office Action and English Translation received from the JPO dated Mar. 4, 2014 for appln. No. 2011-171908, 20 pgs.
Nguyen, Hieu P., Notice of Allowance received from the USPTO dated Mar. 13, 2014 for U.S. Appl. No. 13/054,781, 19 pgs.
Le, Dinh Thanh, Notice of Allowance received from the USPTO dated Mar. 12, 2014 for U.S. Appl. No. 12/460,442, 12 pgs.
Englund, Terry Lee, Office Action received from the USPTO dated May 23, 2014 for U.S. Appl. No. 13/932,996, 13 pgs.
Hiltunen, Thomas J., Office Action received from the USPTO dated May 22, 2014 for U.S. Appl. No. 13/933,006, 10 pgs.
Burgener, et al., Response filed in the USPTO dated Jun. 3, 2014 for U.S. Appl. No. 13/796,780, 17 pgs.
Peregrine Semiconductor Corporation, English translation of Response filed in the Japanese Patent Office on Apr. 28, 2014 for appln. No. 2012-243547, 5 pgs.
Peregrine Semiconductor Corporation, Response filed in the EPO dated May 9, 2014 for appln. No. 11154275.9, 4 pgs.
Peregrine Semiconductor Corporation, Response and English translation filed n the Japanese Patent Office dated Jun. 3, 2014 for appln. No. 2011-171908, 21 pgs.
Le, Dinh Thanh, Notice of Allowance received from the USPTO dated Jul. 8, 2014 for related U.S. Appl. No. 12/460,442, 15 pgs.
Nguyen, Hieu P., Notice of Allowance received from the USPTO dated Jul. 8, 2014 for related U.S. Appl. No. 13/054,781, 61 pgs.
Mehari, Yemane, Office Action received from the USPTO dated Mar. 15, 2013 for U.S. Appl. No. 13/016,875, 83 pgs.
Kim, et al., Amendment filed in the USPTO dated Jul. 12, 2013 for U.S. Appl. No. 13/016,875, 8 pgs.
Mehari, Yemane, Notice of Allowance received from the USPTO dated Aug. 20, 2013 for U.S. Appl. No. 13/016,875, 17 pgs.
Mehari, Yemane, Notice of Allowance received from the USPTO dated Jan. 2, 2014 for U.S. Appl. No. 13/016,875, 15 pgs.
Mehari, Yemane, Notice of Allowance received from the USPTO dated Apr. 14, 2014 for U.S. Appl. No. 13/016,875, 12 pgs.
Kim, et al., Comments on Examiner's Statement of Reasons for Allowance filed in the USPTO dated Jul. 14, 2014 for U.S. Appl. No. 13/016,875, 3 pgs.
European Patent Office, Extended Search Report received from the EPO dated Jan. 8, 2015 for appln. No. 14178741.6, 6 pgs.
Imbernon, L, Decision to grant a European Patent pursuant to Article 97(1) EPC received from the EPO dated Jul. 3, 2014 for appln. No. 04816848.8, 2 pgs.
Peregrine Semiconductor Corporation, Response filed in the EPO dated Aug. 19, 2014 for appln. No. 09798318.3, 20 pgs.
Englekirk, Robert Mark, Response filed in the USPTO dated Aug. 25, 2014 for U.S. Appl. No. 13/932,996, 14 pgs.
Englund, Terry Lee, Final Office Action received from the USPTO dated Sep. 18, 2014 for U.S. Appl. No. 13/769,780, 25 pgs.
European Patent Office, Communication received from the EPO dated Oct. 1, 2014 for appln. No. 14178741.6, 1 pg.
Wells, Kenneth, Office Action received from the USPTO dated Oct. 20, 2014 for U.S. Appl. No. 14/230,945, 5 pgs.
Nguyen, Hieu P., Notice of Allowance received from the USPTO dated Nov. 13, 2014 for U.S. Appl. No. 13/054,781, 13 pgs.
Englekirk, Robert Mark, Response filed in the USPTO dated Nov. 13, 2014 for U.S. Appl. No. 13/933,006, 12 pgs.
Swonger, James, Response filed in the USPTO dated Dec. 18, 2014 for U.S. Appl. No. 14/230,945, 6 pgs.
Burgener, et al., Response After Final Office Action dated Dec. 18, 2014 for U.S. Appl. No. 13/769,780, 21 pgs.
Le, Dinh Thanh, Notice of Allowance received from the USPTO dated Jan. 2, 2015 for related U.S. Appl. No. 12/460,442, 23 pgs.
Englund, Terry, Advisory Action received from the USPTO dated Jan. 6, 2015 for U.S. Appl. No. 13/769,780, 12 pgs.
Englund, Terry, Final Office Action received from the USPTO dated Jan. 20, 2015 for U.S. Appl. No. 13/932,996, 65 pgs.
Englekirk, Robert Mark, Response filed in the USPTO dated Nov. 18, 2016 for U.S. Appl. No. 15/179,416, 17 pgs.
Wells, Kenneth, Final Office Action received from the USPTO dated Jan. 5, 2017 for U.S. Appl. No. 14/883,525, 18 pgs.
Nguyen, Hieu P., Notice of Allowance received from the USPTO dated Jan. 12, 2017 for U.S. Appl. No. 14/638,954, 14 pgs.
Meulemans, Bart, Communication Pursuant to Article 94(3) EPC received from the EPO dated Dec. 17, 2015 for appln. No. 09798318.3, 4 pgs.
Hiltunen, Thomas J., Notice of Allowance received from the USPTO dated Oct. 8, 2015 for U.S. Appl. No. 13/933,006, 9 pgs.
Englekirk, Robert Mark, Response filed in the USPTO dated Oct. 27, 2015 for U.S. Appl. No. 13/932,996, 12 pgs.
Skibinski, Thomas S., Final Office Action received from the USPTO dated Nov. 9, 2015 for U.S. Appl. No. 13/932,996, 31 pgs.
Skibinski, Thomas S., Advisory Action received from the USPTO dated Feb. 23, 2016 for U.S. Appl. No. 13/932,996, 8 pgs.
Kim, et al., Response to Restriction Requirement filed in the USPTO dated Feb. 29, 2016 for U.S. Appl. No. 14/638,954, 8 pgs.
Suzuki, Shigeyuki, English translation of Office Action received from the JPO dated Feb. 2, 2016 for appln. No. 2014-260387, 3 pgs.
Swonger, James, Amendment filed in the USPTO dated Dec. 1, 2015 for U.S. Appl. No. 14/230,945, 8 pgs.
Wells, Kenneth, Notice of Allowance received from the USPTO dated Jan. 21, 2016 for U.S. Appl. No. 14/230,945, 14 pgs.
Englekirk, Robert Mark, Amendment After Final Office Action filed in the USPTO dated Feb. 9, 2016 for U.S. Appl. No. 13/932,996, 17 pgs.
Nguyen, Hieu P., Office Action received from the USPTO dated Dec. 30, 2015 for U.S. Appl. No. 14/638,954, 6 pgs.
Swonger, James, Amendment filed in the USPTO dated Jul. 6, 2015 for U.S. Appl. No. 14/230,945, 10 pgs.
Peregrine Semiconductor Corporation, Response filed in the EPO dated Jul. 14, 2015 for appln. No. 14178741.6, 9 pgs.
Wells, Kenneth, Advisory Action received from the USPTO dated Jul. 15, 2015 for U.S. Appl. No. 14/230,945, 4 pgs.
Skibinski, Thomas, Office Action received from the USPTO dated Jul. 27, 2015 for U.S. Appl. No. 13/932,996, 43 pgs.
Wells, Kenneth, Notice of Allowance received from the USPTO dated Sep. 4, 2015 for U.S. Appl. No. 13/769,780, 9 pgs.
Wells, Kenneth, Office Action received from the UPSPTO dated Sep. 4, 2015 for U.S. Appl. No. 14/230,945, 79 pgs.
Wells, Kenneth B., Office Action received from the USPTO dated Jan. 20, 2015 for U.S. Appl. No. 14/230,945, 13 pgs.
Hiltunen, Thomas, Final Office Action received from the USPTO dated Apr. 2, 2015 for U.S. Appl. No. 13/933,006, 20 pgs.
Matsumoto, Yasunori, English translation of Office Action received from the JPO dated Feb. 10, 2015 for appln. No. 2012-243547, 2 pgs.
Kim, et al., Comments on Examiner's Statement of Reasons for Allowance filed in the USPTO dated Feb. 13, 2015 for U.S. Appl. No. 13/054,781, 3 pgs.
Englekirk, Robert Mark, Response to Final Pre-RCE Office Action filed in the USPTO dated Mar. 20, 2015 for U.S. Appl. No. 13/932,996, 14 pgs.

(56) References Cited

OTHER PUBLICATIONS

Englekirk, Robert Mark, Response After Final Office Action filed in the USPTO dated Mar. 23, 2015 for U.S. Appl. No. 13/933,006, 16 pgs.
Swonger, James, Amendment filed in the USPTO dated Apr. 20, 2015 for U.S. Appl. No. 14/230,945, 9 pgs.
Wells, Kenneth, Notice of Allowance received from the USPTO dated May 4, 2015 for U.S. Appl. No. 13/769,780, 28 pgs.
Wells, Kenneth, Final Office Action received from the USPTO dated May 6, 2015 for U.S. Appl. No. 14/230,945, 13 pgs.
Peregrine Semiconductor Corporation, Translation of Response filed in the JPO dated May 12, 2015 for appln. No. 2012-243547, 4 pgs.
Englekirk, Robert Mark, Response After Final Office Action filed in the USPTO dated Jun. 2, 2015 for appln. No. (17 pgs.).
Hiltunen, Thomas, Notice of Allowance received from the USPTO dated Jun. 12, 2015 for U.S. Appl. No. 13/933,006, 17 pgs.
Kim, et al., Preliminary Amendment filed in the USPTO dated Dec. 8, 2014 for U.S. Appl. No. 14/462,193, 5 pgs.
Mehari, Yemane, Office Action received from the USPTO dated Mar. 18, 2021 for U.S. Appl. No. 16/744,027, 51 pgs.
Mehari, Yemane, Notice of Allowance received from the USPTO dated Jul. 28, 2021 for U.S. Appl. No. 16/744,027, 8 pgs.
Wells, Kenneth, Final Office Action received from the USPTO dated Aug. 14, 2019 for U.S. Appl. No. 16/169,831, 19 pgs.
Mehari, Yemane, Office Action received from the USPTO dated Mar. 20, 2019 for U.S. Appl. No. 16/143,142, 13 pgs.
Mehari, Yemane, Notice of Allowance received from the USPTO dated Oct. 15, 2019 for U.S. Appl. No. 16/143,142, 20 pgs.
Mehari, Yemane, Office Action received from the USPTO dated Feb. 20, 2018 for U.S. Appl. No. 15/688,597, 12 pgs.
Mehari, Yemane, Notice of Allowance received from the USPTO dated Jul. 17, 2018 for U.S. Appl. No. 15/688,597, 12 pgs.
Kim, et al., Response filed in the USPTO dated Apr. 3, 2018 or U.S. Appl. No. 15/688,597, 3 pgs.
Kim, et al., Preliminary Amendment filed in the USPTO dated Nov. 6, 2017 for U.S. Appl. No. 15/688,597, 3 pgs.
Gentili, et al., Communication under Rule 71(3) EPC received from the EPO dated Sep. 6, 2018 for appln. No. 14178741.6, 29 pgs.
Nguyen, Hieu P., Notice of Allowance received from the USPTO dated Dec. 7, 2018 for U.S. Appl. No. 15/602,042, 17 pgs.
Wells, Kenneth, Office Action received from the USPTO dated May 1, 2019 for U.S. Appl. No. 16/169,831, 21 pgs.
Osemi Corporation, Response filed in the USPTO dated May 20, 2019 for U.S. Appl. No. 16/143,142, 8 pgs.
Wells, Kenneth, Final Office Action received from the USPTO dated Jul. 5, 2018 for U.S. Appl. No. 14/883,525, 22 pgs.
Wells, Kenneth, Notice of Allowance received from the USPTO dated Aug. 30, 2018 for U.S. Appl. No. 14/883,525, 13 pgs.
Nguyen, Hieu P., Final Office Action received from the USPTO dated Sep. 11, 2018 for U.S. Appl. No. 15/602,042, 12 pgs.
Skibinski, Thomas S., Notice of Allowance received from the USPTO dated Mar. 28, 2018 for U.S. Appl. No. 15/670,945, 9 pgs.
Nguyen, Hieu P., Office Action received from the USPTO dated Mar. 16, 2018 for U.S. Appl. No. 15/602,042, 26 pgs.
Wells, Kenneth B., Office Action received from the USPTO dated Feb. 22, 2018 for U.S. Appl. No. 14/883,525, 19 pgs.
Mehari, Yemane, Office Action received from the USPTO dated Mar. 22, 2017 for U.S. Appl. No. 15/059,206, 35 pgs.
Mehari, Yemane, Notice of Allowance received from the USPTO dated Jul. 3, 2017 for U.S. Appl. No. 15/059,206, 25 pgs.
Mehari, Yemane, Notice of Allowance received from the USPTO dated Jul. 21, 2016 for U.S. Appl. No. 14/462,193, 12 pgs.
MEULEMANS Bart, Communication pursuant to Article 94(3) EPC received from the EPO dated Jul. 29, 2016 for appln. No. 11154276.9, 4 pgs.
Wells, Kenneth B., Office Action received from the USPTO dated Aug. 16, 2016 for U.S. Appl. No. 14/883,525, 25 pgs.
Skibinski, Thomas, Office Action received from the USPTO dated Aug. 23, 2016 for U.S. Appl. No. 15/179,416, 28 pgs.
Nguyen, Hieu, Office Action received from the USPTO dated Sep. 16, 2016 for U.S. Appl. No. 14/638,954, 19 pgs.
Englekirk, Robert Mark, Response to Non-Final Office Action filed in the USPTO dated Jun. 21, 2017 for U.S. Appl. No. 15/382,483, 11 pgs.
Skibinski, Thomas S., Notice of Allowance received from the USPTO dated Jun. 22, 2017 for U.S. Appl. No. 15/179,416, 14 pgs.
Hiltunen, Thomas J., Notice of Allowance received from the USPTO dated Aug. 17, 2017 for U.S. Appl. No. 15/382,483, 20 pgs.
Peregrine Semiconductor Corporation, Response filed in the EPO dated Jun. 8, 2016 for appln. No. 09798318.3, 14 pgs.
Kim, et al., Response to Non-Final Office Action filed in the USPTO dated Jun. 23, 2016 for U.S. Appl. No. 14/638,954, 15 pgs.
Skibinski, Thomas, Notice of Allowance received from the USPTO dated Mar. 11, 2016 for U.S. Appl. No. 13/932,996, 13 pgs.
Mehari, Yemane, Notice of Allowance received from the USPTO dated Mar. 29, 2016 for U.S. Appl. No. 14/462,193, 17 pgs.
Hiltunen, Thomas, Office Action received from the USPTO dated Apr. 14, 2016 for U.S. Appl. No. 14/911,577, 13 pgs.
Englekirk, Robert Mark, Amendment filed in the USPTO dated Jun. 10, 2016 for U.S. Appl. No. 14/911,577, 20 pgs.
Swonger, James, Comments on Examiner's Statement of Reasons for Allowance filed in the USPTO dated Apr. 21, 2016 for U.S. Appl. No. 14/230,945, 4 pgs.
Nguyen, Hieu P., Office Action received from the USPTO dated May 11, 2016 for U.S. Appl. No. 14/638,954, 79 pgs.
Mehari, Yemane, Notice of Allowance received from the USPTO dated Feb. 17, 2016 for U.S. Appl. No. 14/462,193, 17 pgs.
Hiltunen, Thomas J., Notice of Allowance received from the USPTO dated May 10, 2017 for U.S. Appl. No. 14/991,577, 10 ppgs.
Skibinski, Thomas S., Notice of Allowance received from the USPTO dated Apr. 24, 2017 for U.S. Appl. No. 15/179,416, 15 pgs.
Englekirk, Robert Mark, Response filed in the USPTO dated Mar. 30, 2017 for U.S. Appl. No. 15/179,416, 16 pgs.
Wells, Kenneth, Office Action received from the USPTO dated Apr. 17, 2017 for U.S. Appl. No. 14/883,525, 13 pgs.
Skibinski, Thomas S., Office Action received from the USPTO dated Mar. 2, 2017 for U.S. Appl. No. 15/179,416, 52 pgs.
Hiltunen, Thomas J., Notice of Allowance received from the USPTO dated Mar. 22, 2017 for U.S. Appl. No. 14/991,577, 9 pgs.
Hiltunen, Thomas J., Office Action received from the USPTO dated Aug. 17, 2017 for U.S. Appl. No. 15/382,483, 20 pgs.
Hiltunen, Thomas J., Final Office Action received from the USPTO dated Aug. 1, 2016 for U.S. Appl. No. 14/991,577, 17 pgs.
Englekirk, Robert Mark, Response After Final Office Action filed in the USPTO dated Oct. 31, 2016 for U.S. Appl. No. 14/991,577, 14 pgs.
Burgener, et al., Response filed in the USPTO dated Nov. 11, 2016 for U.S. Appl. No. 14/883,525, 10 pgs.
Hiltunen, Thomas J., Notice of Allowance received from the USPTO dated Nov. 18, 2016 for U.S. Appl. No. 14/991,577, 11 pgs.

* cited by examiner

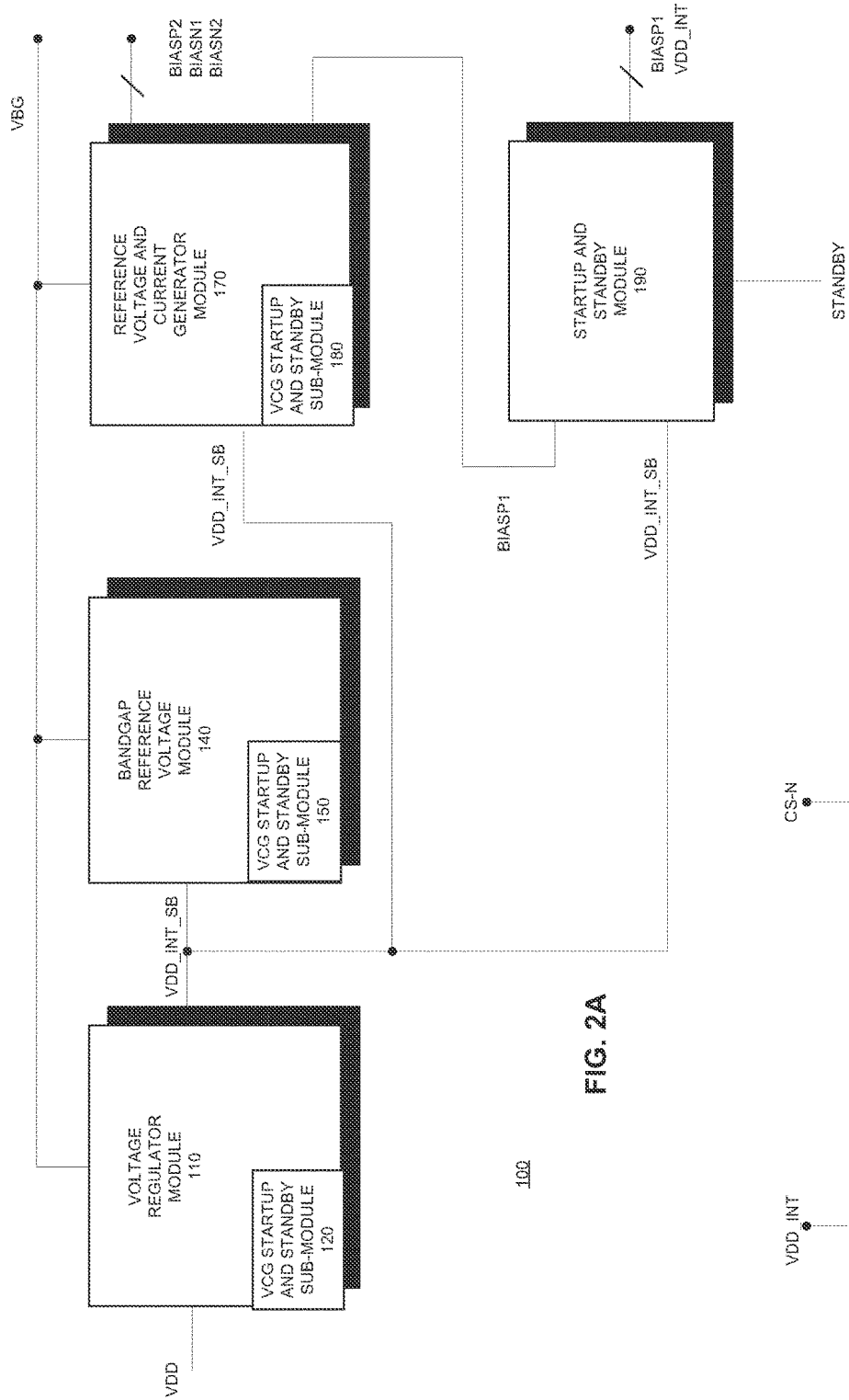
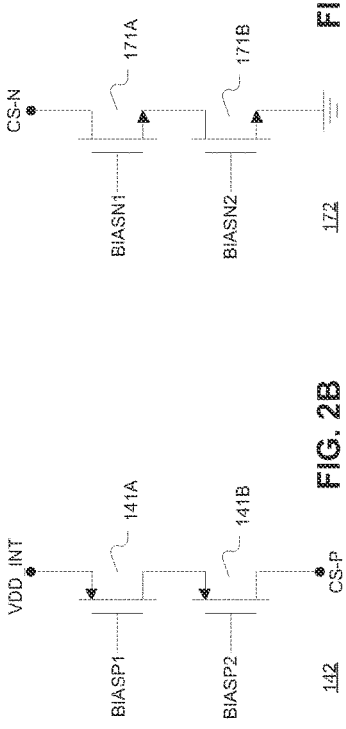
FIG. 2A
FIG. 2B
FIG. 2C

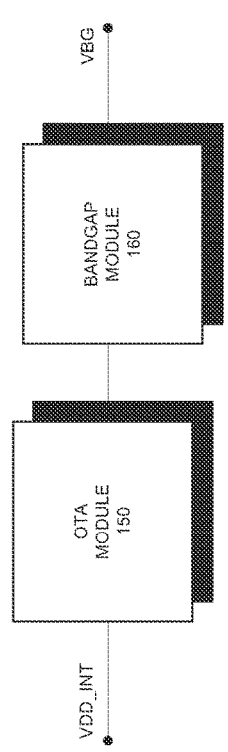
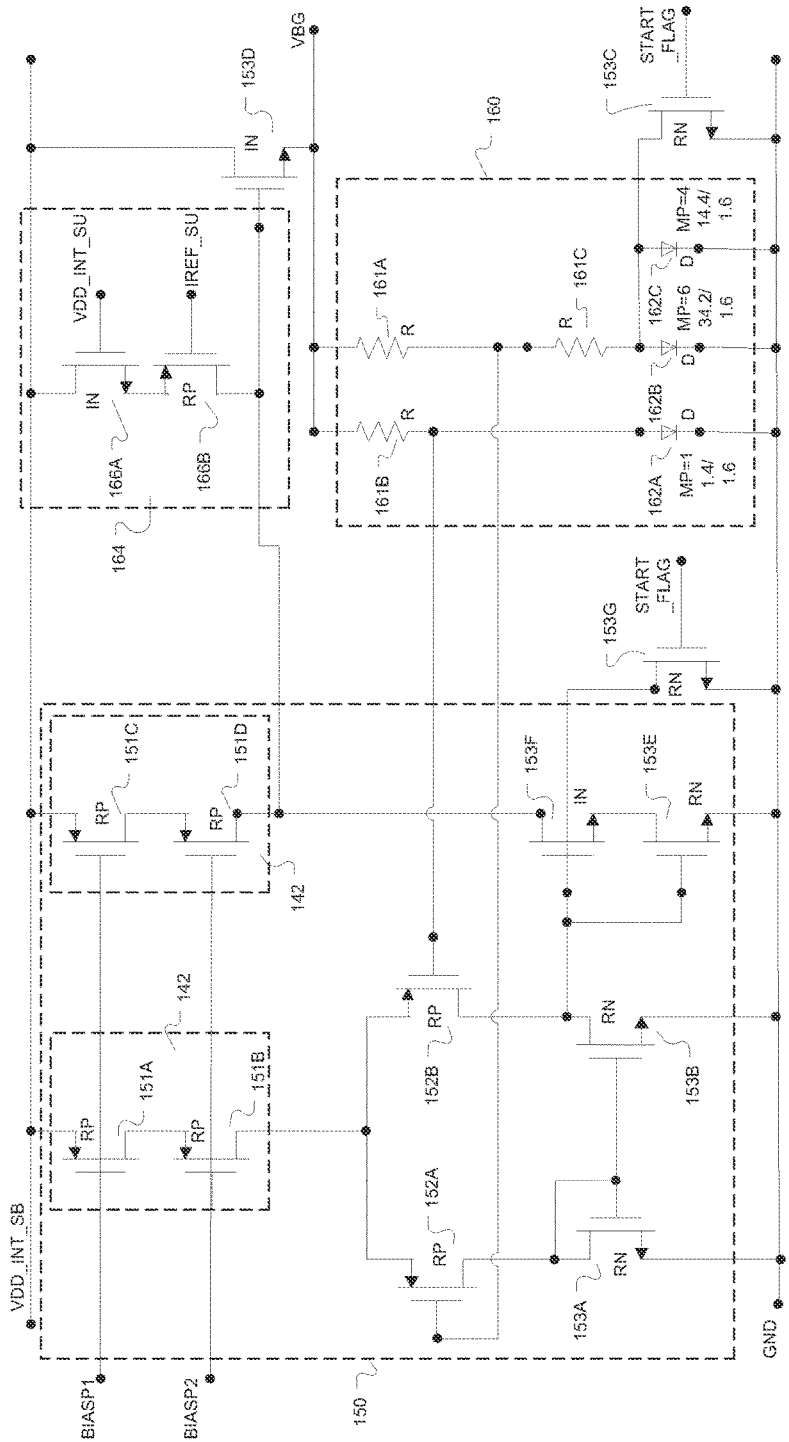
FIG. 6A
FIG. 6B

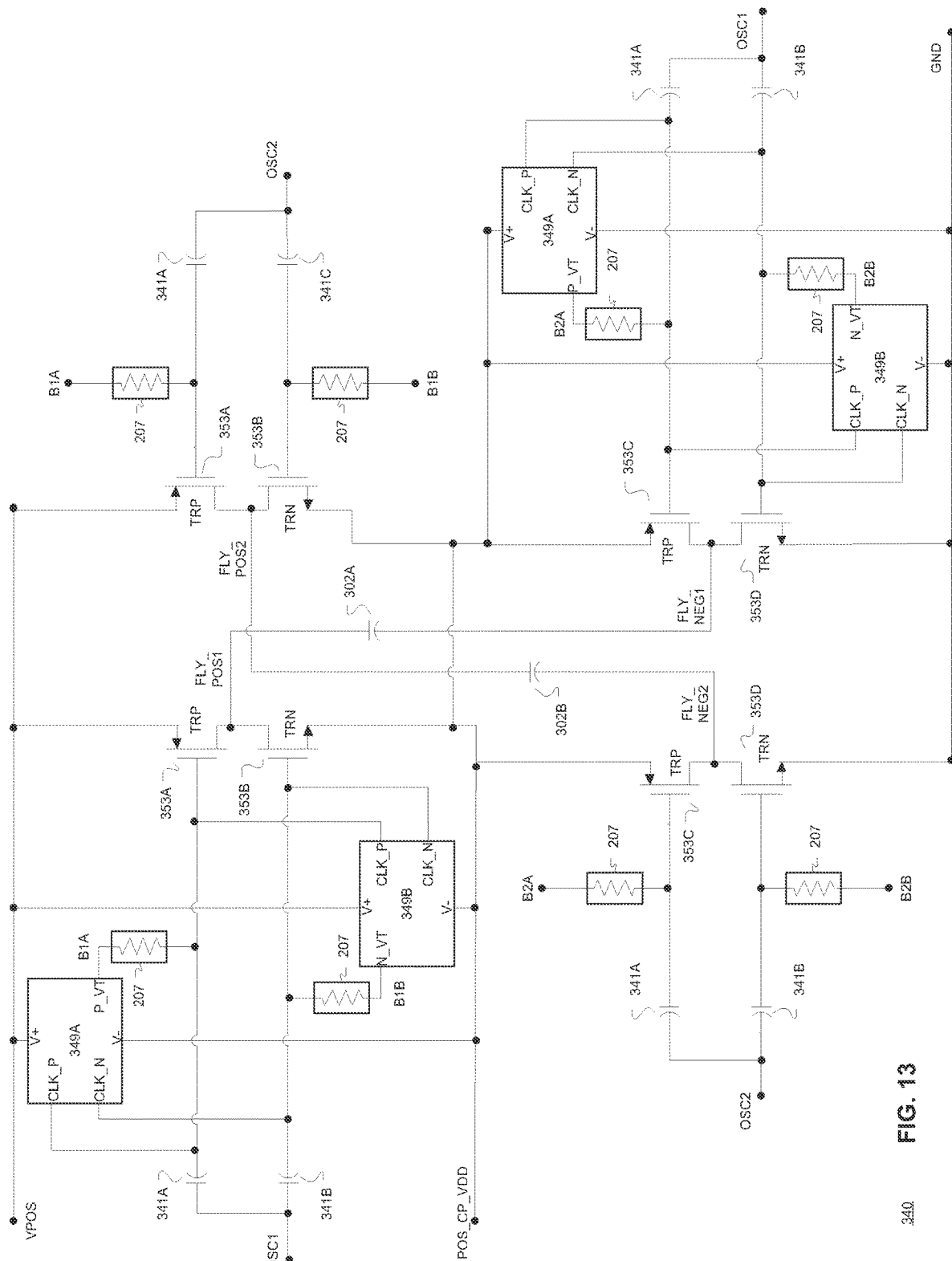

LOW-NOISE HIGH EFFICIENCY BIAS GENERATION CIRCUITS AND METHOD

CLAIMS OF PRIORITY—CROSS REFERENCE TO RELATED APPLICATIONS

The present application is a continuation of commonly owned U.S. patent application Ser. No. 17/530,290 filed on Nov. 18, 2021, to issue on May 30, 2023 as U.S. Pat. No. 11,662,755, incorporated herein by reference in its entirety; application Ser. No. 17/530,290 is a continuation of commonly owned U.S. patent application Ser. No. 16/744,027 filed on Jan. 15, 2020, issued on Nov. 30, 2021 as U.S. Pat. No. 11,188,106, incorporated herein by reference in its entirety; application Ser. No. 16/744,027 is a continuation of commonly owned U.S. patent application Ser. No. 16/143,142 filed on Sep. 26, 2018, now U.S. Pat. No. 10,571,940, issued February 2020, incorporated herein by reference in its entirety; application Ser. No. 16/142,142 is a continuation of commonly owned U.S. patent application Ser. No. 15/688,597 filed on Aug. 28, 2017, now U.S. Pat. No. 10,114,391, issued Oct. 30, 2018, incorporated herein by reference in its entirety; application Ser. No. 15/688,597 is a continuation of commonly owned U.S. patent application Ser. No. 15/059,206 filed on Mar. 2, 2016, now U.S. Pat. No. 9,778,669, issued Oct. 3, 2017, incorporated herein by reference in its entirety; application Ser. No. 15/059,206 is a continuation of commonly owned U.S. patent Ser. No. 14/462,193 filed on Aug. 18, 2014, now U.S. Pat. No. 9,429,969 issued Aug. 30, 2016, incorporated herein by reference in its entirety; application Ser. No. 14/462,193 is a continuation of commonly owned U.S. patent application Ser. No. 13/016,875 filed on Jan. 28, 2011, now U.S. Pat. No. 8,816,659 issued on Aug. 26, 2014, incorporated herein by reference in its entirety; application Ser. No. 13/016,875 claims the benefit under 35 U.S.C. § 119 (e) of U.S. Provisional Application No. 61/371,652, filed Aug. 6, 2010, entitled "Low-Noise High Efficiency Bias Generation Circuits and Method", and U.S. Provisional Application No. 61/372,086, filed Aug. 9, 2010, entitled "Low-Noise High Efficiency Bias Generation Circuits and Method"; and the present continuation application is related to commonly-assigned U.S. application Ser. No. 13/054,781, filed Jan. 18, 2011, and entitled "Low-Noise High Efficiency Bias Generation Circuits and Method", now U.S. Pat. No. 8,994,452, issued Mar. 31, 2015, said U.S. application Ser. No. 13/054,781 being the U.S. National Stage Filing pursuant to U.S.C. § 371 of International Application Number PCT/US2009/004149 filed Jul. 17, 2009 (published by WIPO Jan. 21, 2010, as International Publication Number WO 2010/008586 A2), which application claims priority to U.S. application No. 61/135,279 filed Jul. 18, 2008 and entitled "Low Noise Charge Pump with Common-Mode Tuning Op Amp", and the contents of all of the above-referenced provisional applications, publications, pending applications, and issued patents are incorporated by reference herein in their entirety.

TECHNICAL FIELD

Various embodiments described herein relate generally to bias signal generators and regulators including systems, and methods used in bias regulators.

BACKGROUND INFORMATION

It may be desirable to provide stable voltage and current signals to a variable load device, the present invention provides such signals.

BRIEF DESCRIPTION OF THE DRAWINGS

FIG. 2A is a simplified block diagram of a base bias signal generation module according to various embodiments.

FIG. 2B is a simplified diagram of a current source module according to various embodiments.

FIG. 2C is a simplified diagram of a current sink module according to various embodiments.

FIG. 6A is a block diagram of a bandgap reference module (BRM) according to various embodiments.

FIG. 6B is a simplified diagram of a bandgap reference module (BRM) according to various embodiments.

FIG. 13 is simplified diagram of a positive voltage charge pump generation module (PVCPGM) according to various embodiments.

DETAILED DESCRIPTION

Figure 1:
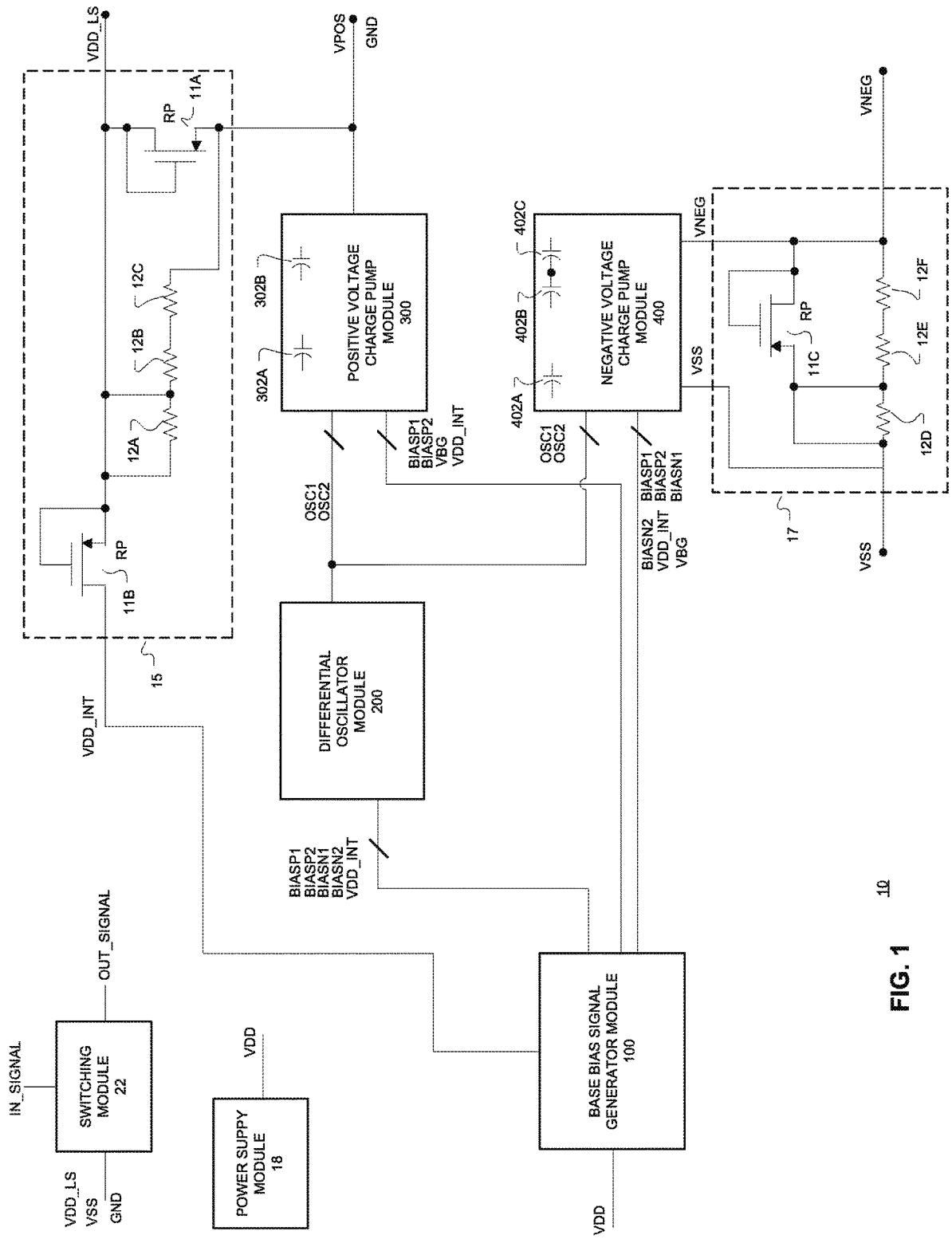
FIG. 1 is a simplified block diagram of bias signal generation architecture according to various embodiments.

FIG. 1 is a simplified block diagram of bias signal generation architecture ('BSGA") 10 according to various embodiments. The BSGA 10 includes a base bias signal generator module ("BBSGM") 100, a differential oscillator module ("DOM") 200, a positive voltage charge pump module ("PVCPM") 300, a negative voltage charge pump module ("NVCPM") 400, a positive voltage clamping module ("PVCM") 15, a negative voltage clamping module ("NVCM") 17, a power supply module 18, and a switching module 22. The power supply module 18 may provide a variable power supply signal VDD and the module 18 may include one or more batteries, capacitors or other electrical energy generation elements. The PSM 18 may be designed to supply a VDD signal having a predetermined voltage or current levels. The energy generation elements performance may vary as a function of temperature, load, age, and depletion level. For example, a single cell battery may initial provide a signal having a voltage level of about 4 volts and may degrade to less than 2 volts as the battery depletes and temperature or load fluctuates.

The BSGA 10 generates one or more signals VDD_LS, VSS for the switching module 22 where VDD_LS may be a positive rail supply signal and the VSS may be a negative rail supply signal. The load from the switching module 22 generally varies significantly as the module performs one or more switching events. For example, a switching module 22 including a radio frequency (RF) switch may have a nominal load between switching events and then a significant load with a quick rise time for the respective load, IN_SIGNAL. The BSGA 10 should be able to meet the load requirements of the switching module 22 while receiving a varying supply signal VDD from one or more power supply modules 18. Further, the BSGA 10 should perform these functions using minimal energy (efficient power consumption) and provide little or no undesirable noise on the loads signals VDD_LS and VSS.

In an embodiment, the base bias signal generator module ("BBSGM") 100, the differential oscillator module ("DOM") 200, the positive voltage charge pump module ("PVCPM") 300, the negative voltage charge pump module ("NVCPM") 400, the positive voltage clamping module ("PVCM") 15, and the negative voltage clamping module ("NVCM") 17 operate in whole or part to receive the VDD signal from the PSM 18 and efficiently generate the signals VDD_LS and VSS. The BBSGM 100 may receive a variable voltage signal VDD from PSM 18 and generate a plurality of stable bias signals BIASP1, BIASP2, BIASN1, BIASN2, and an internal, positive rail supply VDD_INT. In an embodiment, the BBSGM 100 may function with a received VDD signal having a voltage level from 2.3 volts to 5.5 volts. Accordingly, the BBSGM 100 may effectively regulate the power supply module 18 external supply signal VDD.

As shown in FIG. 1, the PVCM 15 may include several P-type diodes 11A, 11B, and resistors 12A, 12B, 12C. In an embodiment, the signal VDD_LS is targeted to be about +3.4 Volts. Diode 11A tightly couples the node VDD_LS to the node VPOS (the output of the positive voltage charge pump module 300) during a switching event. The diode 11A may effectively bypass the resistors 12A, 12B, 12C and any capacitance during a switching event. In an embodiment, the diode 11A may have no voltage drop (0 volts across it) during steady state. VPOS provides the positive voltage signal to PVCM 15. The resistors 12A, 12B, and 12C may filter and limit the current draw from VPOS to VDD_LS.

The diode 11A may be forward biased when the voltage level of VPOS is greater than the voltage level of VDD_LS. Diode 11B is forward biased when the voltage level of the signal VDD_INT is greater than the voltage level of VDD_LS. Diode 11B may effectively clamp or provides a floor value for VDD_LS given the voltage level of VDD_INT is nominally 2.3 Volts. In an embodiment, the diodes 11A, 11B may be CMOS field-effect transistor (FET) s. Diode 11A may have a width of about 10 microns, a length of about 0.4 microns and number of channels (mt)=10, denoted as 10/0.4/mt=10. Using this nomenclature, Diode 11B may be 10/0.4/mt=5 in an embodiment. Resistors 12A, 12B, 12C may have a width/length/resultant resistance where length and width are in microns and resistance is in Kilo Ohms. Using this nomenclature in an embodiment resistors 12A, 12B, 12C may be about 10.7/1.4/19.98, 5.3/1.4/9.982, 2.8/1.4/5.353, respectively.

As discussed below with reference to FIG. 2A, the BBSGM 100 may include a Voltage Regulator Module 110 (VRM), a Bandgap Reference Module 140 (BRM), a Reference Voltage and Current Generator Module 170 (RVCGM), and a Startup and Standby Module 190 (SSM). The VRM 110 may receive the variable voltage external signal VDD and generate a stable internal voltage signal VDD_INT_SB. The BRM 140 may receive the internal signal VDD_INT_SB and generate a stable reference signal (VBG). The Reference Voltage and Current Generator Module 170 (RVCGM) may receive the VBG and VDD_INT_SB signal and generate a first and second bias signal for P-type devices (BIASP1, BIASP2) and a first and second bias signal for N-type devices (BIASN1, BIASN2).

Figure 9A:
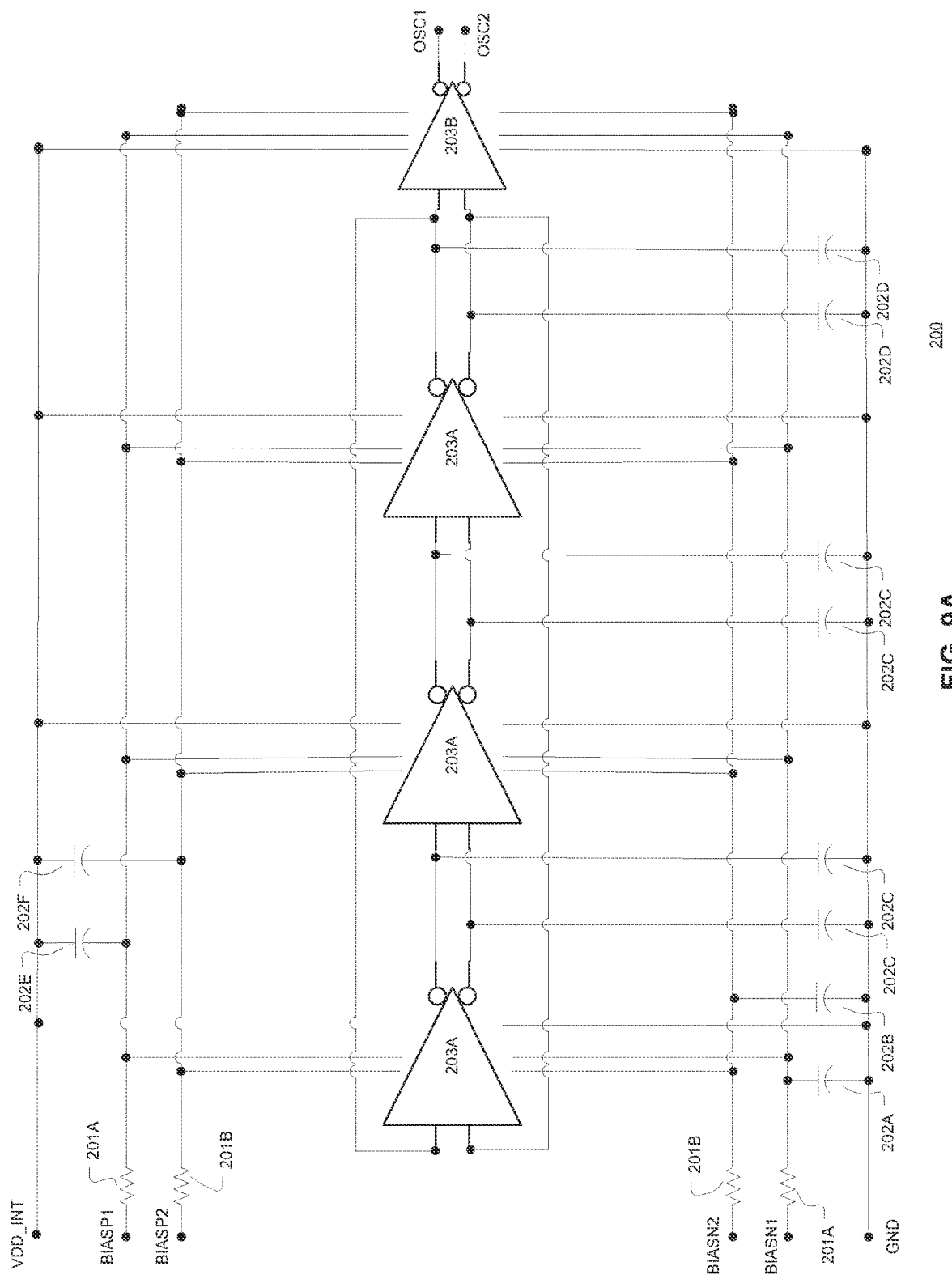
FIG. 9A is simplified diagram of differential oscillator architecture according to various embodiments.
Figure 9B:
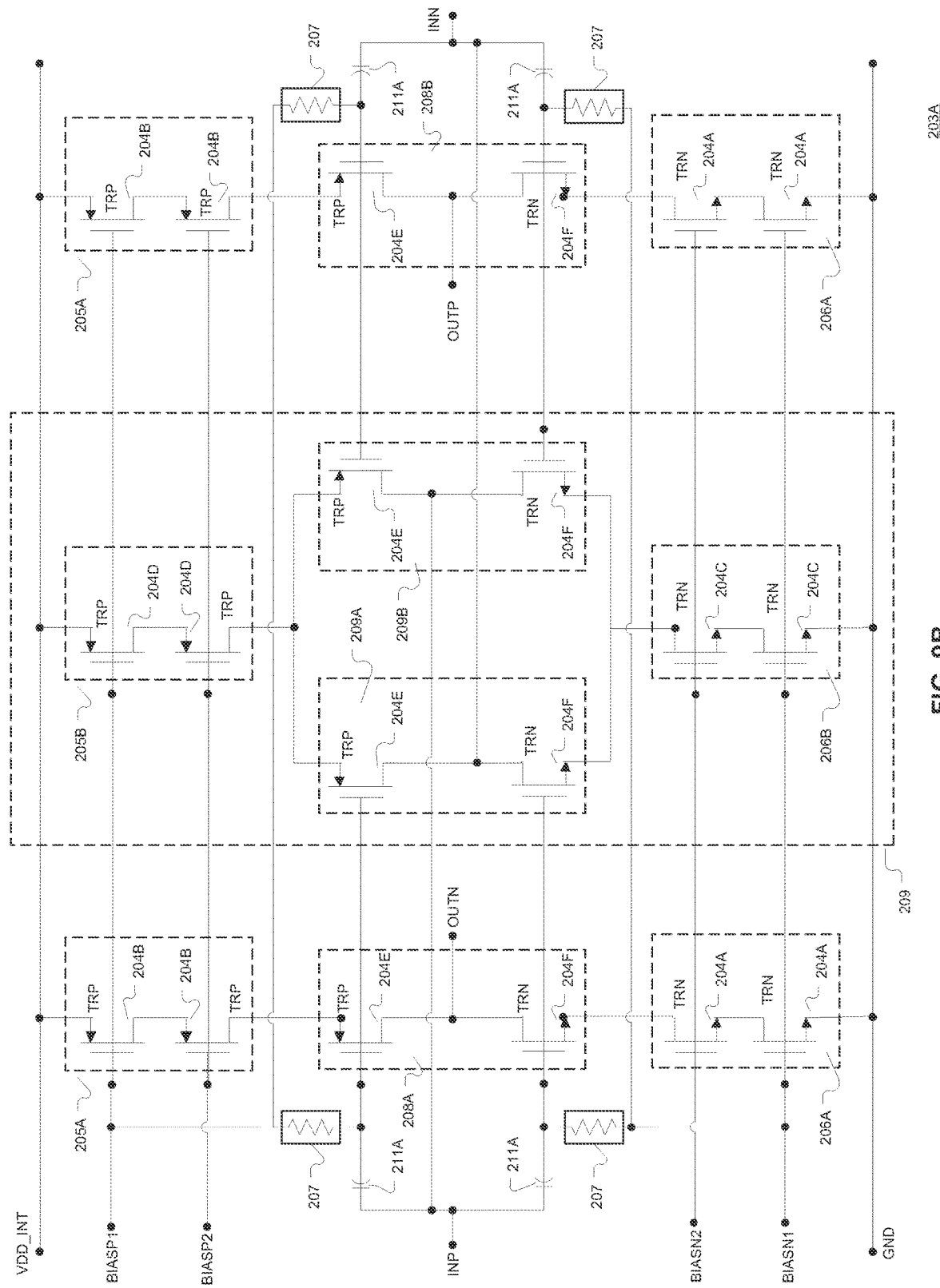
FIG. 9B is simplified diagram of a differential oscillator according to various embodiments.

The DOM 200 may receive the stable bias signals BIASP1, BIASP2, BIASN1, BIASN2, and internal, positive rail supply VDD_INT generated by BBSGM 100 and generate one or more oscillation or clock signals OSC1, OSC2. In an embodiment, the DOM 200 may be a capacitively coupled three stage differential inverter ring as shown in FIG. 9A. In an embodiment, each stage 203A may use coupling capacitors to separately drive P-MOS 204E and N-MOS 204F devices (as shown in FIG. 9B). Other embodiments are also possible without differential inverters, by providing a single-ended to differential conversion in the output stage (not shown).

The PVCPM 300 may receive the stable bias signals BIASP1, BIASP2, VBG and internal, positive rail supply VDD_INT generated by BBS GM 100, and OSC1, OSC2 from the DOM. The PVPCM 300 provides a positive voltage signal output VPOS. In an embodiment, the switching module 22 may receive three voltage signals, a ground GND, a positive voltage signal VDD_LS, and a negative voltage signal VSS. The PVCPM VPOS signal provides for the regulated positive rail voltage VDD_LS. In an embodiment the signal VDD_LS is targeted to be about 3.4 volts. Switching modules 22 commonly include a large capacitance that must be driven within a strict time frame (within 5us in an embodiment).

In an embodiment, the VSS signal recovery time (after a switching event) may affect the harmonic knee point (HKP) of a signal IN_SIGNAL switched by the switching module 22 to generate OUT_SIGNAL. In an embodiment, the VDD_LS signal recovery time after a switching event may affect the insertion loss of a signal IN_SIGNAL switched by the switching module 22 to generate OUT_SIGNAL. A VDD_LS signal fast settling time may reduce the switching module 22 switched signal IN_SIGNAL insertion loss. The NVCPM 400 generates a negative voltage signal VNEG. As noted, the NVCPM 400 ideally settles quickly (the VNEG voltage level is back to desired level(s)) after a load event (switching event in an embodiment)). As noted the signal settling time may affect the HKP of the switching module 22.

As shown in FIG. 1, the NVCM 17 may include a P-type diode 11C, and resistors 12D, 12E, 12F. In an embodiment, the signal VSS is targeted to be about −3.4 Volts. Diode 11C may tightly couple the node VSS to the node VNEG (the output of the negative voltage charge pump module 400) during a switching event. The diode 11C may effectively bypass the resistors 12D, 12E, 12F and any capacitance generated during a switching event. In an embodiment, the diode 11C may have no voltage drop (0 volts across it) during steady state. VNEG provides the negative voltage signal to VSS. The resistors 12D, 12E, and 12F may filter and limit the current draw from VNEG to VSS. The diode 11C may be forward biased when the voltage level of VNEG is less than the voltage level of VSS. In an embodiment, the diode 11C may be a CMOS field-effect transistor (FET). The Diode 11C may be about 10/0.4/mt=10. Resistors 12A, 12B, 12C may have a width/length/resultant resistance of about 10.7/1.4/19.98, 5.3/1.4/9.982, and 2.8/1.4/5.353, respectively.

FIG. 2A is a simplified block diagram of a Base Bias Signal Generation Module 100 according to various embodiments. As noted the BBSGM 100 may include a Voltage Regulator Module 110 (VRM), a Bandgap Reference Module 140 (BRM), a Reference Voltage and Current Generator Module 170 (RVCGM), and a Startup and Standby Module 190 (SSM). The VRM 110 receives the external, variable voltage signal VDD and regulates the voltage level to be about 2.3 volts in an embodiment. The VRM 110 provides the regulated voltage VDD_INT_SB to the BRM 140 and the RVCGM 170.

The BRM 140 receives the reference voltage VDD_INT_SB signal and generates a VBG (bandgap voltage) signal of about 1.16V (in an embodiment) and passes the reference signal VBG to the RVCGM 170 and the VRM 110. The VRM 110 may use the VBG signal to determine and set the level of the VDD_INT_SB. In an embodiment the VBG signal level is a function of physical diode element formation and resistor combination that comprises the BRM 140.

The RVCGM 170 receives the VBG signal and the VDD_INT_SB signal and generates a reference current of about 1.2 uA (in an embodiment) and gate bias reference voltages BIASP1, BIASP2, BIASN1, and BIASN2. FIG. 2B is a simplified diagram of a current source module 142 according to various embodiments. The current source CS-P 142 includes a plurality of cascaded P-type field-effect transistor (FET)s 141A, 141B. When the bias signals BIASP1 and BIASP2 are stable, the current generated by the cascaded FETs 141A, 141B is also stable, constant, and about 1.2 uA in an embodiment. In an embodiment, the bias gate signal BIASP1 sets the level of the basis current. BIASP2 provides higher output impedance to the CS-P 142. In an embodiment, the P-FETs 141A, 141B may be about 4/2/mt=1, 4/2/mt=1 respectively.

FIG. 2C is a simplified diagram of a current sink module CS-N 172 according to various embodiments. The current source CS-N 172 includes a plurality of cascaded N-type field-effect transistor (FET)s 171A, 171B. When the bias signals BIASN1 and BIASN2 are stable, the current drawn by the cascaded FETs 171A, 171B may also be stable, constant, and about 1.2 uA. In an embodiment, the N-FETs 171A, 171B may be about 4/2/mt=1, 4/2/mt=1 respectively. The use of the CS-P and CS-N and respective gate bias signals BIASP1, BIASP2, BIASN1, BIASN2 may reduce the usage of resistors and transistors to control current source and sink levels.

In an embodiment the CS-P 142 and the CS-N 172 are used in operational amplifiers (OPAMP) and operational trans-conductance amplifiers (OTA) in the VRM 110, the BRM 140, the DOM 200, the PVCPM 300, and the NVCPM 400. The RVCGM 170 receives the VBG signal and may employ a known resistance to generate a signal with a known current, IREF. The RVCGM 170 also generates the gate bias voltages BIASP1, BIASP2, BIASN1, and BIASN2.

In an embodiment the BBSGM 100 may also include startup and standby components 190, 120, 150, 180. As noted in an embodiment the VRM 110, the BRM 140, and the RVCGM 170 may provide reference signals to other modules DOM 200, PVCPM 300, NVCPM 400. Similarly the BRM 140 provides a reference signal to the VRM 110 and the RVCGM 170. During a standby condition or startup, the SSM 190 may suppress the VDD_INT signal to stop operation of the DOM 200, PVCPM 300, NVCPM 400 modules. Such an interruption of the VDD_INT signal may reduce the power consumption of the architecture 10. The BBSGM 100 may still operate in order to receive and process standby and wake signals.

Figure 3:
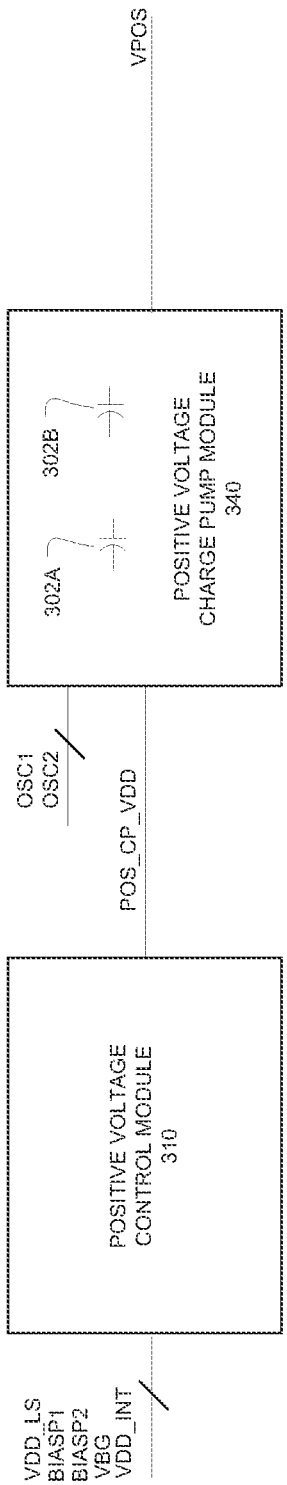
FIG. 3 is a block diagram of a positive voltage signal generation module according to various embodiments.

FIG. 3 is a block diagram of a PVCPM 300 according to various embodiments. The PVCPM 300 may include a control module 310 and a charge pump module 340. The control module 310 may receive the gate bias signals BIASP1, BIASP2, internal voltage signal VDD_INT, VBG and VDD_LS, and generate a control signal POS_CP_VDD representing a desired voltage signal level. The charge pump module 340 may receive the POS_CP_VDD signal and clock signals OSC1, OSC2 and generate a positive voltage signal VPOS.

Figure 4:
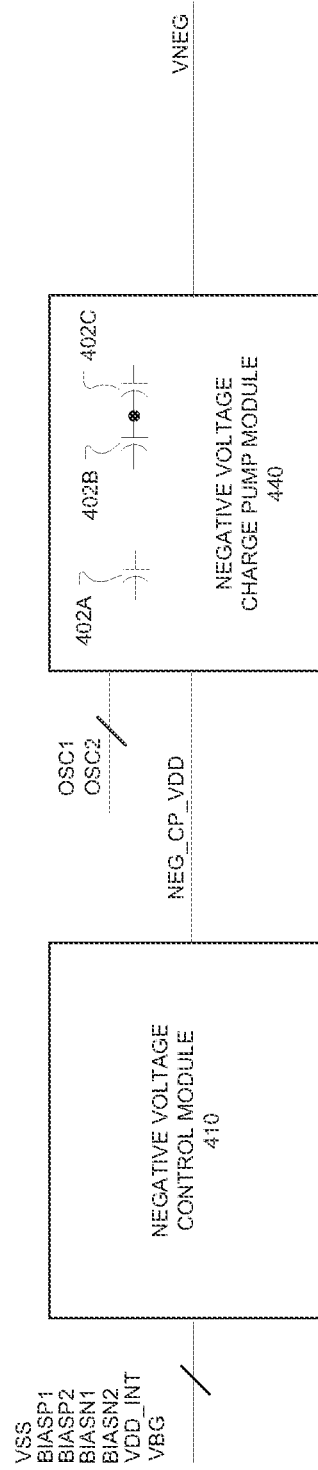
FIG. 4 is a block diagram of a negative voltage signal generation module according to various embodiments.

FIG. 4 is a block diagram of a NVCPM 400 according to various embodiments. The NVCPM 400 may include a control module 410 and a charge pump module 440. The control module 410 may receive the gate bias signals BIASP1, BIASP2, BIASN1, BIASN2, internal voltage signal, VDD_INT, VBG and VSS and generate a control signal NEG_CP_VDD representing a desired voltage signal level. The charge pump 440 module may receive the NEG_CP_VDD signal, and clock signals OSC1, OSC2, and generate the negative voltage signal VNEG.

Figure 5A:
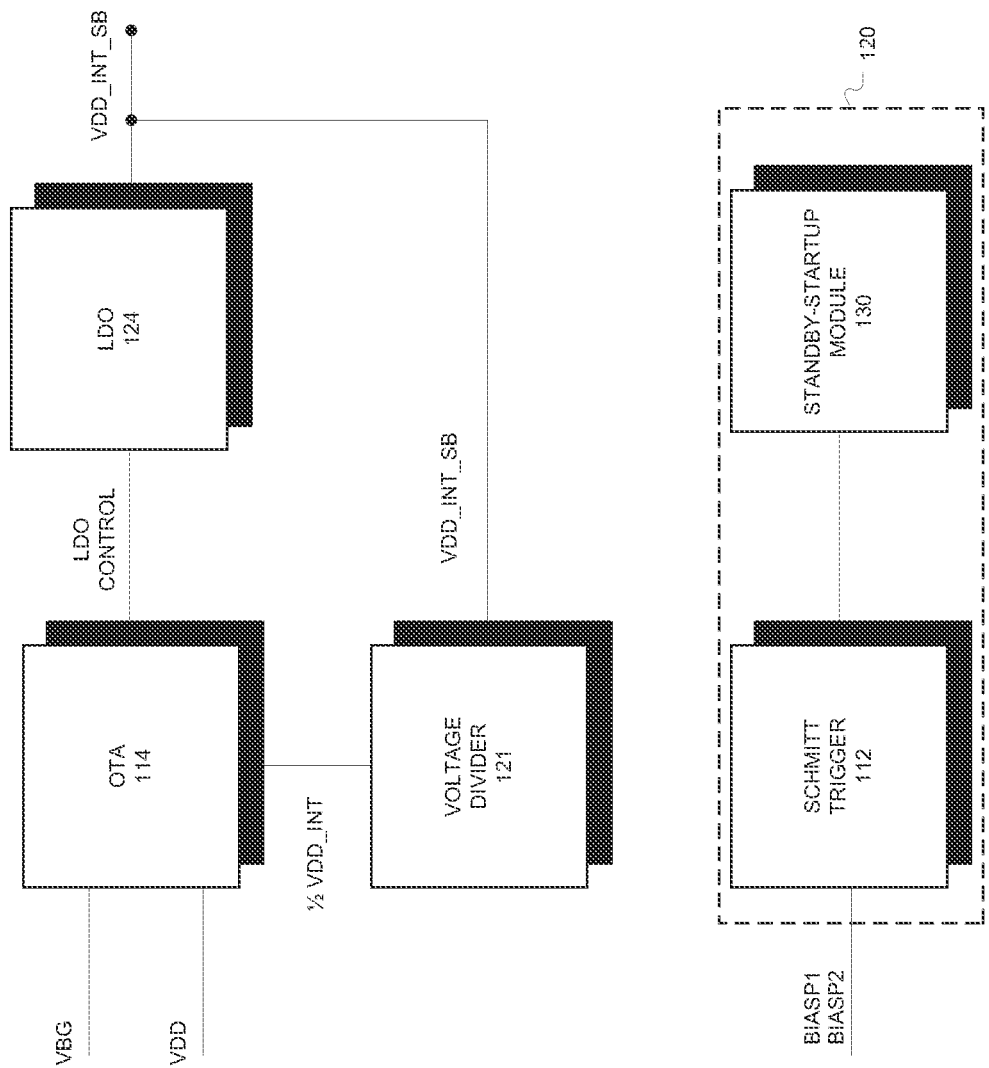
FIG. 5A is a block diagram of a voltage regulation module (VRM) according to various embodiments.

FIG. 5A is a block diagram of a voltage and current regulation module (VRM) 110 according to various embodiments. As shown in FIG. 5A, the VRM 110 may include an OTA 114, an LDO 124, a voltage divider 121, a Schmitt trigger 112, and a standby-startup module 130. The voltage divider 121 may receive the internal voltage signal VDD_INT_SB as a feedback signal and generate a voltage signal about ½ the voltage signal VDD_INT_SB (½ VDD_INT) in one embodiment. The OTA 114 may receive the external voltage signal VDD, the internal bandgap reference signal VBG, and a voltage reference (½ VDD_INT) equal to half of the internal voltage VDD_INT_SB. The OTA 114 determines the differential between the signal VBG and ½ VDD_INT_SB. In an embodiment the VBG signal voltage level is about ½ the desired internal voltage of the signal VDD_INT_SB. Accordingly, the OTA differential signal represents the difference between the desired voltage level and the current voltage level of the VDD_INT_SB signal.

The OTA 114 generates an LDO control signal where the signal varies as a function of the determined voltage level differential signal. In an embodiment the low drop out ("LDO") module 124 receives the VDD signal and generates the internal voltage signal VDD_INT_SB based on the LDO control signal generated by the OTA 114. The Schmitt trigger 112 may be set to trip when the BIASP1 signal reaches a desired voltage level. The BIASP1 desired predetermined voltage level may indicate that the BBSGM 100 is fully operational after a startup or standby event. The standby-startup module 130 may use the trigger 112 signal to determine the operational status of VRM 110 after a restart or standby event.

Figure 5B:
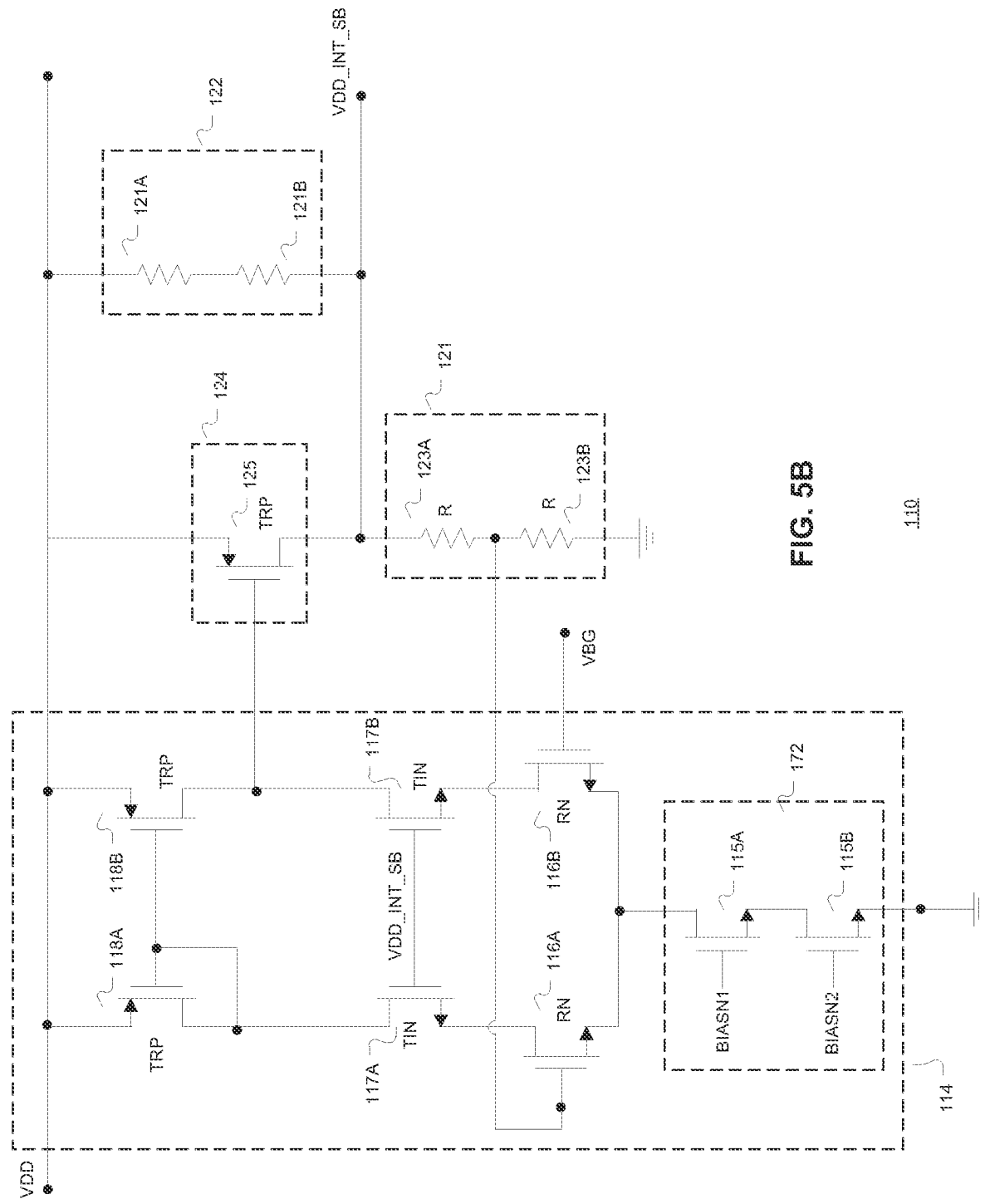
FIG. 5B is a simplified diagram of a voltage regulation module (VRM) according to various embodiments.

FIG. 5B is a simplified diagram of a voltage and current regulation module (VRM) 110 according to various embodiments. As shown in FIG. 5B, the VRM 110 may include an OTA 114, a low drop out FET (LDO) 124, a voltage divider 121, and resistors 122. The OTA 114 may include the CS-N 172 to create a current sink of about 1.2 uA in an embodiment. The OTA 114 also includes cascade intrinsic N-type FETs 117A, 117B, thicker film regular type P-type FETs (TRP) 118A, 118B, and regular type N-type FET (RN) 116A, 116B. The FETs 118A, 118B, 116A, 116B form a trans-impedance amplifier that determines the difference between the inputs at the gates of 116A, 116B.

The TINs 117A, 117B may be coupled at their respective gates. The reference signal VBG (about 1.16 V in an embodiment) may be received at gate 116B. The other gate 116A receives the divided voltage signal ½VDD_INT (half of the internal voltage signal VDD_INT_SB in an embodiment) from the voltage divider 121. In an embodiment, the TRP-FETs 118A, 118B may be about 4/2/mt=1, 4/2/mt=1, respectively. The TIN-FETs 117A, 117B may be about 4/1/mt=1, 4/1/mt=1, respectively. The RN-FETs 116A, 116B may be about 4/2/mt=2, 4/2/mt=2, respectively. The cascade current sink N-FETs 115A, 115B may be about 4/2/mt=1, 4/2/mt=1, respectively as noted above.

The voltage divider 121 may include several resistors 123A, 123B. When the resistance of the resistors 123A, 123B are about equal, the gate of 116A may be about ½ of the internal voltage signal VDD_INT_SB. In an embodiment the resistor 123A may have a resistance of about 604 Kohms and may include multiple, coupled resistors including resistors that may be about 13.5/1.4/50.34/ms=2, and 13.5/1.4/553.7/ms=22, respectively. The resistor 123B may have a resistance of about 604 Kohms and may include multiple, coupled resistors including resistors that may be about 13.5/1.4/25.17/ms=1, 13.5/1.4/75.51/ms=3, 13.5/1.4/302/ms=12, and 13.5/1.4/201.4/ms=8, respectively.

The LDO 124 is a TRP receiving its gate signal from the OTA 114. The LDO 124 generates or regulates the internal voltage signal VDD_INT_SB based on the gate signal. In an embodiment, the LDO 124 TRP may be about 10/0.5/mt=8. Accordingly, the VRM 110 may receive an external signal VDD having a voltage range of 2.3 to 5.5V and provide an internal voltage signal that is about 2.3 volts in an embodiment. The cascaded TINs 117A, 117B, may break up the drain voltage of the differential pair 116A, 116B from the differential load 118A, 118B to develop output voltage on the OTA 114. The TRP pair 118A, 118B may form a current mirror differential load. In an embodiment the OTA 114 may effectively be a differential pair with active load that may handle higher voltage given VDD may vary. The resistors 121A, 121B may be about 9.5/1.4/35.52/ms=2 and respectively.

FIG. 6A is a block diagram of a bandgap reference module (BRM) 140 and FIG. 6B is a simplified diagram of the BRM 140 according to various embodiments. As shown in FIGS. 6A, 6B, the BRM 140 may include an OTA module 150, a bandgap module 160, and a standby-startup module 164. The bandgap module 160 may include resistors 161A, 161B, and 161C and diodes 162A, 162B, 162C having different channel widths to generate a voltage differential that is measured by the OTA 150. The diodes 162A, 162B may be about 1.4/1.6/mp=1, 34.2/1.6/mp=6, and 14.4/1.6/mp=1 respectively in an embodiment. The OTA 150 may use the determined differential to generate the reference voltage signal VBG (about 1.16V in an embodiment).

In an embodiment the diodes 162A, 162B, 162C may both be formed in a single CMOS wafer and due to similar channel lengths (1.6 um in an embodiment) operational variance due to temperature and wafer processing may not change the effective differential (bandgap) between the diodes 162A, 162B, 162C. Accordingly, the related diode 162A, 162B, 162C bandgap may be stable from wafer to wafer and temperature independent. In an embodiment, the resultant VBG level is thus known based on the known diode characteristics (as known by the diode formation process and materials).

The standby-startup module 164 may include an RN FET 153C that bypasses the diodes 162B, 162C based on the state of the START_FLAG. RN FET 153C may be about 4/1/mt=1 in an embodiment. As noted the bandgap module 160 may also include the resistors 161A, 161B, and 161C as shown in FIG. 6B. The resistors 161B, 161C may be about 13.4/1.4/199.8/ms=8 and 13.4/1.4/224.8/ms=9, respectively. The resistor 161A may include two resistors in series and the resistors may be about 13.4/1.4/424.7/ms=17 and 13.4/1.4/24.98/ms=1, respectively.

In an embodiment the OTA 150 may include two current sources CS-P 142 including cascaded FETs RP 151A, 151B and 151C, 151D. The FETs RP 151A, 151B, 151C, 151D may each be about 4/2/mt=1. In an embodiment, each CS-P 142 may provide a current source of about 1.2 uA. The RP pair 152A, 152B and RN pair 153A, 153B may form an amplifier. The amplifier may receive the constant current source from the CS-P (formed from RP pair 151A, 151B) and the differential signal from the diodes 162A, 162B and resistor 161C. Cascaded FETs IN 153F and RN 153E may be coupled to the second current source CS-P 142. The FETs 152A, 152B may each be about 10/2/mt=4, FETs 153A, 153B may each be 10/4/mt=2, FET 153F may be about 7.5/0.5/mt=1, and FET 153E may be about 10/0.9/mt=1. The OTA 150 also includes FET IN 153D. The standby-startup module 164 may further include an RN FET 153G that bypasses the RN FET 153B based on the state of the START_FLAG. RN FET 153G may be about 3/1/mt=1 in an embodiment.

The bandgap reference module 140 may also include a standby-startup module 164. The startup module 164 may include cascaded FETs IN 166A, FET RP 166B where the gates of the respective FETs may receive the VDD_INT_SU and IREF_SU startup signals and FET IN 153D which serves as an output buffer whose gate is coupled to the drain of the FET RP 166B and the output of the second stage amplifier of the op-amp consisting of 153E/F and 151C/D. The FETs IN 166A, RP 166B, IN 153D may be about 4/1/mt=1, 4/1/mt=1, and 14.6/0.5/mt=1, respectively. The startup module 164 ensures the VBG signal reaches the appropriate operational level. VDD_INT_SU is based on VDD_INT and IREF_SU is based on IREF. As noted the standby-startup module 164 also includes RN FETs 153C and 153G.

Figure 7A:
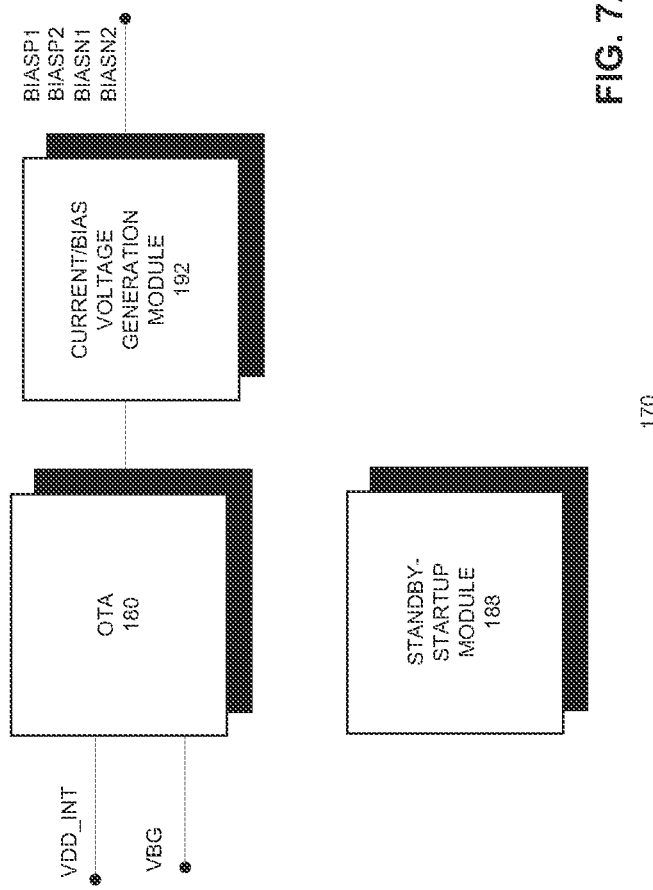
FIG. 7A is a block diagram of a reference voltage and current generator module (RVCGM) according to various embodiments.
Figure 7B:
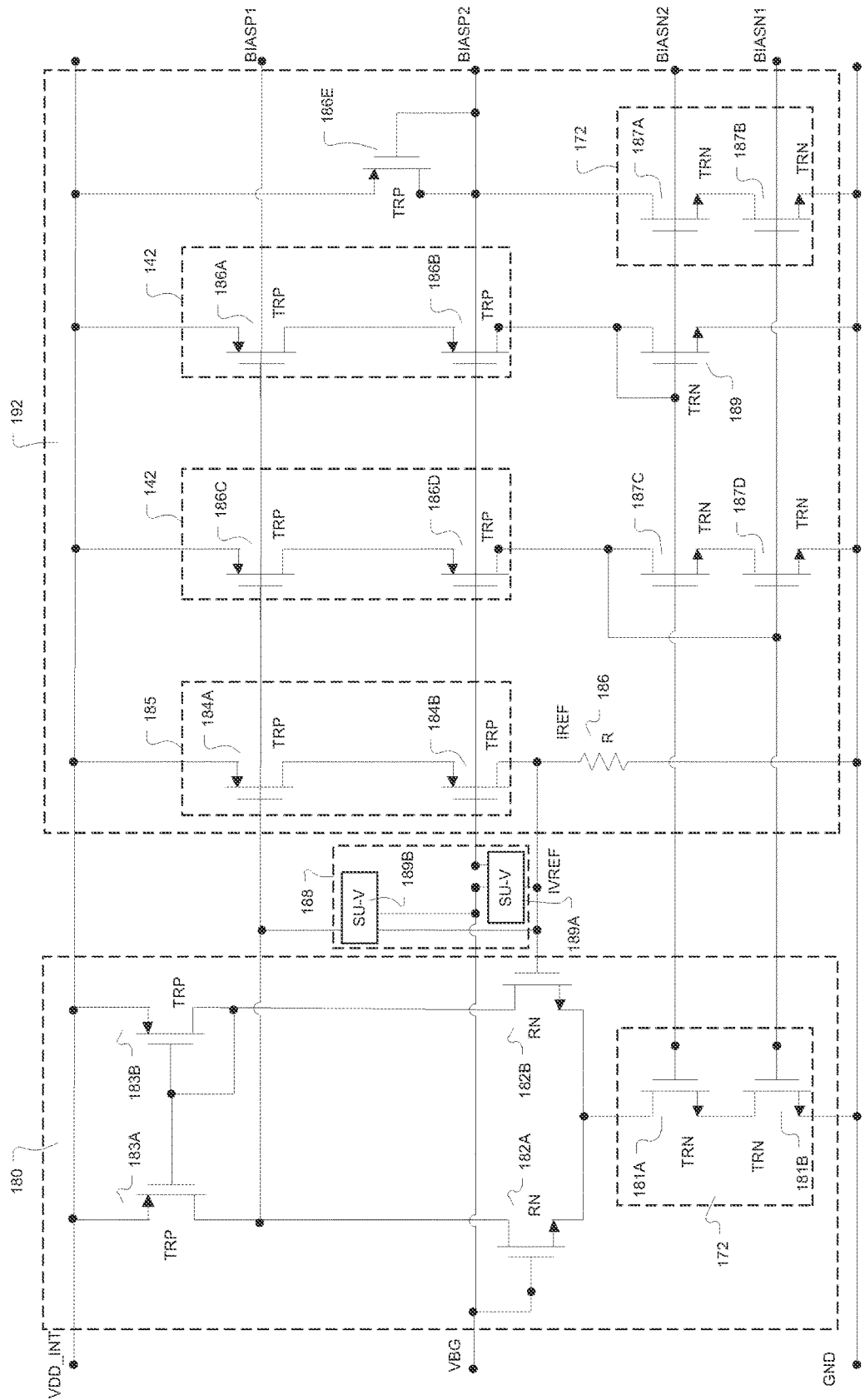
FIG. 7B is a simplified diagram of a reference voltage and current generator module (RVCGM) according to various embodiments.

FIG. 7A is a block diagram of a reference voltage and current generator module (RVCGM) 170 and FIG. 7B is a simplified diagram of the RVCGM 170 according to various embodiments. As shown in FIGS. 7A, 7B, the RVCGM 170 may include an OTA module 180, a current/bias voltage generation module (CBVGM) 192, and standby-startup module 188. The OTA 180 may include a current sink CS-N 172 including cascaded TRN 181A, 181B. The FETs TRN 181A, 181B may be about 4/2/mt=1, 4/2/mt=1, respectively. In an embodiment, the CS-N develops a current sink of about 1.2 uA. The RN pair 182A, 182B and TRP pair 183A, 183B form an amplifier coupled to the constant current sink of CS-N 172 (formed from TRN pair 181A, 181B). The FETs TRP 182A, 182B, 183A, 183B may each be about 4/2/mt=1, respectively.

In an embodiment the OTA 180 may determine the difference of the VBG signal and IVREF signal generated by the LDO 185 and resistor 186 (current across the resistor 186 where the LDO 185 is a current source). The LDO 185 includes cascaded TRP 184A, 184B. In an embodiment the FETs TRP 184A, 184B may be about 4/2/mt=2, and 4/2/mt=2 respectively (note that number of channels is 2—twice the number of the current source 142). Accordingly, the LDO 185 may generate a current source of about 2.4 uA in an embodiment when BIASP1 and BIASP2 are steady state. The resistor 186 may be about 494 K-ohms in an embodiment. Given the LDO 142 is generating a current of about 2.4 uA at steady state and the resistance of 494 Kohms, the voltage level of the signal or point IVREF may be about 1.16 Volts at steady state. The VBG signal voltage level may be about 1.16 volts at steady state and is generated by the BRM 140. The OTA 180 regulates the generation of the IVREF signal using the VBG reference signal and effectively the four gate bias signals BIASN1, BIASN2, BIASP1, and BIASP2.

In an embodiment, the LDO 185 may provide current IREF to resistor 186 to generate the corresponding voltage signal IVREF. The CBVGM 192 generates the gate bias signals BIASP1, BIASP2, BIASN1, and BIASN2. At steady state (when IVREF voltage level is about 1.16 Volts (receiving 2.4 uA from 185), BIASN1 is about the threshold level of the TRN 187B (about 0.7 V in an embodiment). BIASN2 is greater than BIASN1 due to cascaded TRN 187A and TRN 189 (about 200 mV greater in an embodiment or 0.9 V). BIASP1 is about one threshold of the TRP 186A below the supply rail VDD_INT (about 2.3V less 0.7V=1.6V). BIASP2 is lower than BIASP1 due to TRP 186E (about 200 mV less in an embodiment, 1.4 V). It is noted that TRP 186A and TRP 186B form a current source 186C that generates a constant current of 1.2 uA when the gate bias signals BIASP1 and BIASP2 are at steady state (1.6 Volts and 1.4 Volts in an embodiment).

It is noted that the TRP 186A has a different Vgs (Voltage Gate to Source) than TRP 186E due to their different physical configurations (TRP 186A may be have a width/length of about 4/2 (microns), mt=1 and TRP 186E may have a width/length of about 2/8 (microns), mt=1, and TRP 186B may be have a width/length of about 4/2 (microns), mt=1. Similarly, the TRN 189 may have a different Vgs than TRN 187B due to different physical configurations (TRN 187B may be have a width/length of about 4/2 (microns) (mt=1), TRN 189 may have a width/length of about 2/8 (microns) (mt=1), and 187A may be have a width/length of about 4/2 (microns) (mt=1). The CBVGM 192 also includes a current source 142 formed by TRP 186C and TRP 186D coupled to TRN 187C and TRN 187D where each may be about 4/2/1 in an embodiment.

Figure 8:
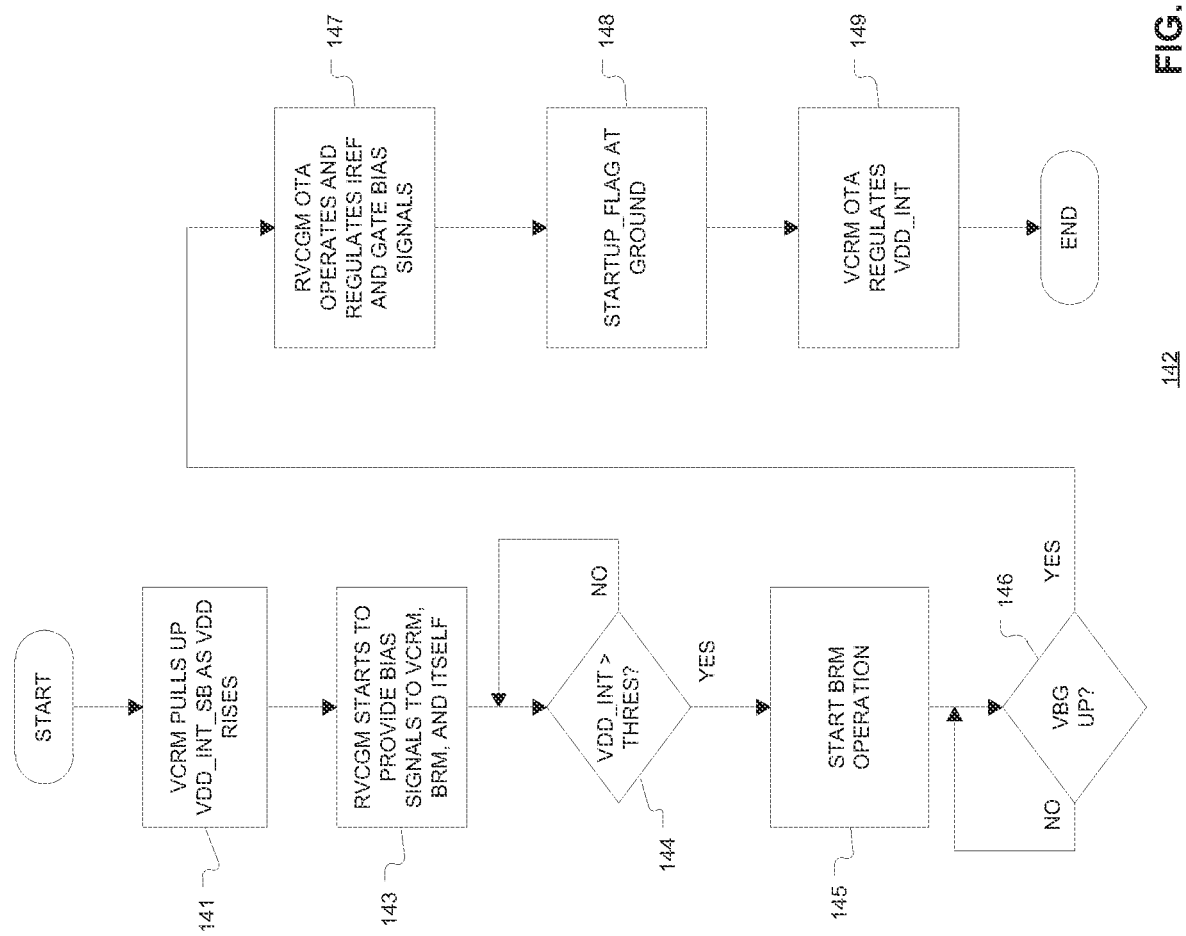
FIG. 8 is a simplified diagram of a start algorithm according to various embodiments.

In an embodiment the BBSGM 100 modules rely on the gate bias signals BIASN1, BIASN2, BIASP1, and BIASP2 and reference signals (VBG) generated by the various modules 110, 140, and 170 to operate at steady state. The remaining modules of the architecture 10 also need steady state gate bias signals BIASN1, BIASN2, BIASP1, and BIASP2. Given the interdependence between the BBSGM 100 modules 110, 140, 170, a startup or standby wake method 142 (FIG. 8) may be employed in an embodiment to enable the BBSGM 100 to reach steady state. Further, startup of BBSGM 100 (from a cold start or standby) may be controlled by additional startup/standby modules as noted above where the modules may employ the method or algorithm 142. FIG. 8 is a simplified diagram of a BBSGM 100 activate (from cold start or standby) algorithm 142 according to various embodiments that may be employed in the BBSGM 100. During a cold start or standby, capacitors of the BSGA 10 may be discharged and external rail supply VDD may be rising. In the process 142, VDD_INT_SB (internal voltage standby) may be pulled up as the external voltage VDD rises (activity 142). In an embodiment the VRM 110 of BBSGM 100 shown in FIG. 5B may include resistors 121A, 121B of standup module 122 that pull up VDD_INT_SB as VDD rises (increase voltage level as current draw is increased in the OTA 114).

As VDD_INT_SB starts to rise, the RVCGM 170 starts to function and generate the gate bias signals BIASN1, BIASN2, BIASP1, BIASP2, which are used by the BRM 140, the RVCGM 170, and the VRM 110 (activity 143). In an embodiment the BRM 140 may not generate a steady state band-gap signal VBG until the internal voltage signal VDD_INT is greater than thresholds 166A, 166B of activate (standby-startup) module 164 (activities 144, 145). In particular, FETs IN 166A, and RP 166B form a valve that pulls up VBG to VDD_INT_SU during startup. VDD_INT_SU may be at ground (GND) at startup. As noted above the FETs IN 166A, RP 166B may be about 4/1/mt=1, 4/1/mt=1, and 166A may have a lower threshold and thus lower voltage drop. At steady state, the voltage level of the signals VDD_INT_SU and IREF_SU are similar so the valves 166A, 166B may become closed or inactive.

Thereafter, the VBG signal may rise to its nominal level (about 1.16V in an embodiment) (activity 146) as the BRM 140 starts to operate (activity 145). The RVCGM 170 OTA 180 may operate and then generate the IREF signal (current level monitored) and corresponding IVREF signal (voltage level monitored) to be compared against the VBG signal voltage level (activity 147). In an embodiment, activate or startup valves 189A, 189B may pull up BIASP1 and BIASP2 during startup. In an embodiment the startup valves 189A, 189B may each include cascaded FETS TRN and IP where the FETS TRN and IP (intrinsic P-type) may be about 2/1/mt=1, 2/1/mt=1, respectively. The TRN gates of 189A, 189B may receive the VBG signal and the IP gates of modules 189A, 189B may be coupled to the signal IVREF. At steady state the voltage level of the signals IVREF and VBG are similar so the valves 189A, 189B may become closed or inactive.

The startup_flag used in the startup modules 190, 120, 150, 180 may be set to end operation of these modules (activity 148) when the RVCGM 170 reaches steady state (activity 147). When the gate bias signals BIASN1, BIASN2, BIASP1, and BIASP2 and reference signal VBG are steady state, the VRM 110 may effectively generate a steady state signal VDD_INT from a variable voltage level input signal (VDD external) where the VDD_INT signal may be used by other BSGA 10 modules (activity 149). In an embodiment the Schmitt trigger 112 may receive the bias signals BIASP1, BIASP2 and limit the operation of the OTA 114 operation and the LDO 124 until the trigger 112 is tripped. Then the VRM 110 may effectively generate the VDD_INT signal from a variable voltage external VDD signal. When process 142 is complete, the gate bias signals BIASN1, BIASN2, BIASP1, and BIASP2, the reference signal VBG, and the VDD_INT may have steady values that may be used by the other BSGA 10 modules. Given this configuration the other modules may be designed based on the availability of constant gate bias signals and voltage supply signals.

As noted the BSGA 10 may provide signals VDD_LS and VSS having known, steady voltage levels to a switching module 22. BSGA 10 may be required to maintain the signals VDD_LS, VSS voltage levels during switching events. In an embodiment, BSGA 10 may employ charge pumps modules 300, 400 (positive and negative) to ensure the voltage levels of the signals VDD_LS and VSS remain constant during loading events. The BSGA 10 may employ a differential oscillator module 200 to control operation of the charge pump module 300, 400 in an embodiment.

FIG. 9A is simplified diagram of differential oscillator module (DOM) 200 according to various embodiments. As shown in FIG. 9A the DOM 200 may include a plurality of ring oscillators 203A and an oscillator output buffer 203B, resistors 201A, 201B, and capacitors 202A to 202F. In an embodiment DOM 200 may receive gate bias signals BIASP1, BIASP2, BIASN1, BIASN2, and internal voltage signal VDD_INT (generated by BBSGM 100) and generates differential oscillator or clock signals OSC1, OSC2. In an embodiment DOM 200 may be a three stage, current starved, AC coupled oscillator. In an embodiment the resistors 201A, 201B may be about 96.2/1.4/356.6/ms=2 and 144.3/1.4/267.4/ms=1, respectively. The capacitors 202A to 202F may be about 18/8.9/941.6fF/mp=1, 24.1/8.9/1.259 pF/mp=1, 0.800/6.9/37fF/mp=1, 0.500/6.25/22.73fF/mp=1, 17/9.6/958.7fF/mp=1, 22.7/9.6/1.278 pF/mp=1, respectively. It is noted that during standby or startup, VDD_INT, BIASN1, BIASN2, BIASP1, and BIASP2 are at GND so DOM 200 may not function during standby or startup.

In an embodiment, each ring oscillator stage 203A contains single ended inverters, side-by-side coupled in anti-phase with other stage 203As. In order to control oscillation frequency, a current starved scheme may be employed where the inverters are not directly coupled to supply rails but are coupled to the supply rails via current sources or sinks (205A, 206A in FIG. 9B). FIG. 9B is simplified diagram of a differential oscillator cell 203A according to various embodiments. The cell 203A includes an inverter 208A formed by a TRP 204E and TRN 204F pair that are coupled by an anti-phase inverter 209 to another inverter 208B also formed by a TRP 204E and TRN 204F pair. The anti-phase inverter 209 includes an inverter 209A formed by a TRP 204E and TRN 204F pair and inverter 209B also formed by A TRP 204E and TRN 204F pair.

The inverters 208A, 208B are each coupled to a current source CS-P 205A (formed by TRP pair 204B) and current sink CS-N 206A (formed by TRN pair 204A). The combination of the CS-P 205A and CS-N 206A on each side of the inverters 208A, 208B starves the inverters 208A, 208B of current. The anti-phase inverter 209 (formed from inverters 209A, 209B) is also coupled to a current source CS-P 205B (formed by TRP pair 204D) and current sink CS-N 206B (formed by TRN pair 204C). In an embodiment the CS-P 205A and CS-N 206A current draw is four times greater than the current draw of CS-P 205B and the CS-N 206B current, respectively. FETS TRP 204B and TRN 204A may be about 10/0.6/mt=1, in an embodiment. The current source 205A may generate about 1.2 uA and the current drain 206A may draw about 1.2 uA (similar to 141A, 141B). FETS TRP 204E and TRN 204F may be about 1.6/0.35/mt=1, in an embodiment. FETS TRP 204D and TRN 204C may be about 2.5/0.6/mt=1, in an embodiment. The current source 205B may generate about 0.3 uA and the current drain 206B may draw about 0.3 uA.

In an embodiment, the threshold of TRP 204B is about 0.7V, which is about the difference between the rail, VDD_INT (2.3 V) and BIASP1 (1.6V). In an embodiment a differential ring cell 203A may not use the gate signals BIASN2 and BIASP2. In operation, an AC component of a signal is passed to the inverter gates 208A, 208B via inputs INP, INN. When the gate bias shifts, the P and N type devices (TRN and TRP) may switch operation to create oscillation. In an embodiment, capacitors 211A may be about 8.8/4.4/232.3fF/mp=1 so only an AC component of the signals INP, INN is passed to the inverters 208A, 208B gates. A DC bias signal is provided by BIASP1 and BIASN1 where any AC content on the BIASP1, BIASN1 signals is removed by active resistors 207 (described below).

Further when one of CS-P 205A is operating the TRP 204B pair is active and the respective TRN 204A pair and CS-N 206A are not active, current is sourced to the respective output (OUTN or OUTP). Similarly, when one of CS-N 206A is operating, the TRN 204A pair is active and the respective TRP 204B pair and the CS-P 205A are not active, current is sinked to the respective output (OUTN or OUTP). Accordingly, a differential ring cell 203A may create a trapezoidal waveform (linear incline and decline with flat tops). As noted, the anti-phase or anti-parallel inverters 209A, 209B are minor inverters compared to the inverter formed by 208A, 208B due to the ¼ current source and sink 205B, 205A. In an embodiment, the inverters 208A may be coupled to the anti-parallel inverter complementary input. In an embodiment the oscillation frequency of the DOM 200 is about 8.2 MHz versus 3.6 MHz in other embodiments. The length of the FETs TRP 204B, 204D and TRN 204A, 204C may be 0.6 um in an embodiment to increase the DOM 200 frequency versus 1.0 um in another embodiment. The reduction of FET lengths from 1.0 um to 0.6 um increases the core bias current by approximately 66% in an embodiment.

Figure 9C:
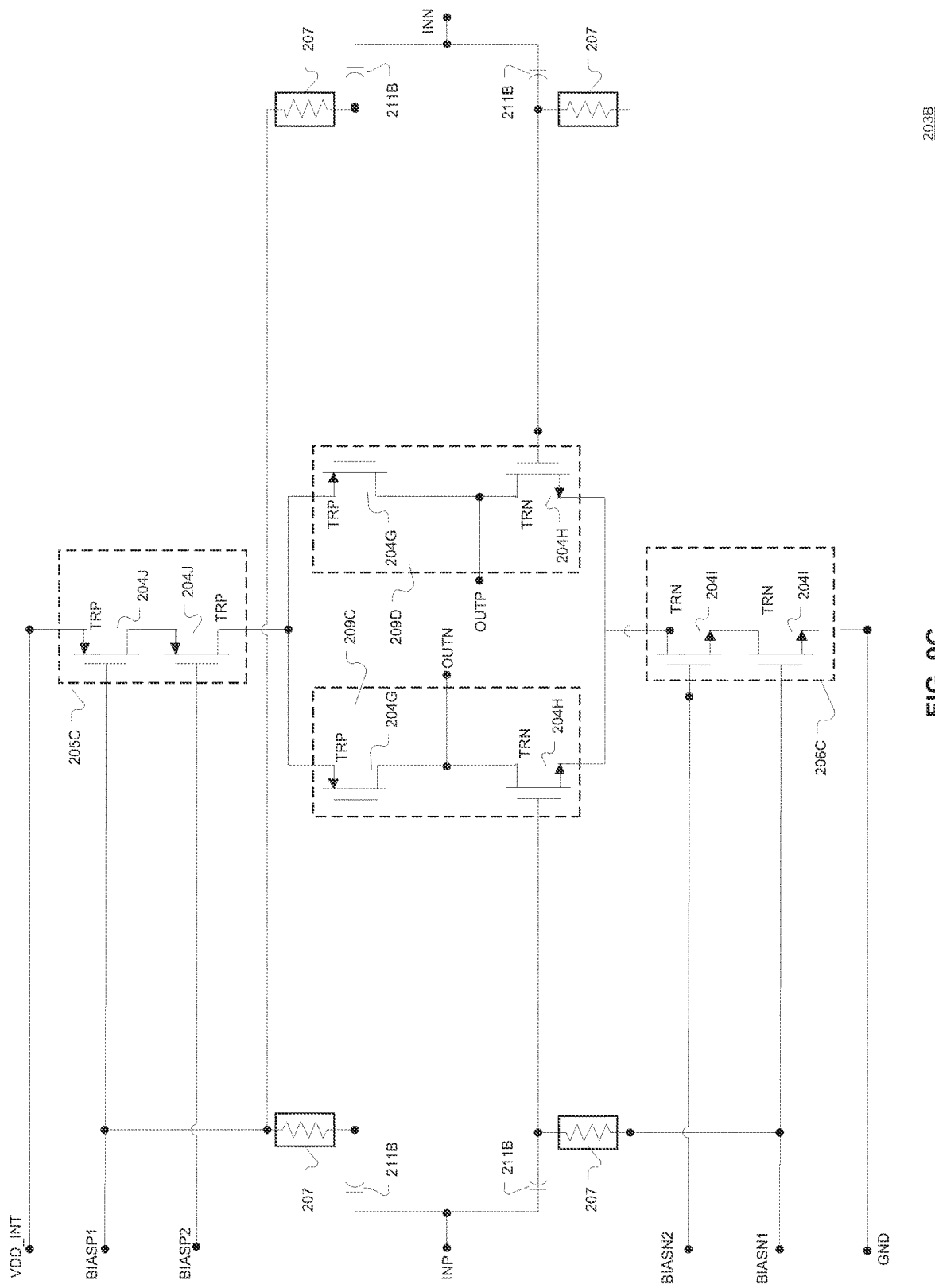
FIG. 9C is simplified diagram of a differential oscillator buffer according to various embodiments.

FIG. 9C is simplified diagram of a differential oscillator buffer 203B according to various embodiments. As show in FIG. 9C, the buffer 203B includes an inverter formed from 209C, 209D, current source CS-P 205C and current sink CS-N 206C, active resistors 207, and capacitors 211B. Similar to differential ring cells 203A, differential ring buffer 203B is AC coupled where a received signal (on INN and INP) is split (between AC and DC). The ABR 207 create a DC bias to drive TRP 204G and TRN 204H devices from the BIASP1 and BIASN1 gate bias signals while not passing any AC content on these signals. The inverters formed by 209C, 209D perform current steering between the two current sources and the outputs. When INN is above INP, the CS-N 206C sinks current from OUTP making it fall, and CS-P 205C sources current to OUTN making it rise. When IPP is above INN, the CS-N 206C sinks current from OUTN making it fall, and CS-P 205C sources current to OUTP making it rise.

In an embodiment the current sinks CS-N 206C and source CS-P 205C pass three times the current of the CS-N 206A and CS-P 205A to prevent shoot through currents. The capacitors 202A to 202F shown in FIG. 9A prevent possible feedback to the BBSGM 100. FETS TRP 204J and TRN 204I may be about 20/0.6/mt=2, in an embodiment. The current source 205C may generate about 3.6 uA and the current drain 206C may draw about 3.6 uA (three times the level of 205A, 206A). FETS TRP 204G and TRN 204H may be about 4/0.35/mt=1 and 2/0.35/mt=1 in an embodiment. In an embodiment, capacitors 211B may be about 10/4.3/257.7fF/mp=1 so only an AC component of the signals INP, INN is passed to the inverters 209C, 209D gates. The length of the FETs TRP 204J and TRN 204I may be 0.6 um in an embodiment to increase the DOM 200 frequency versus 0.8 um in another embodiment. The reduction of FET lengths from 0.8 um to 0.6 um increases the core bias current by approximately 33% in an embodiment.

Figure 10:
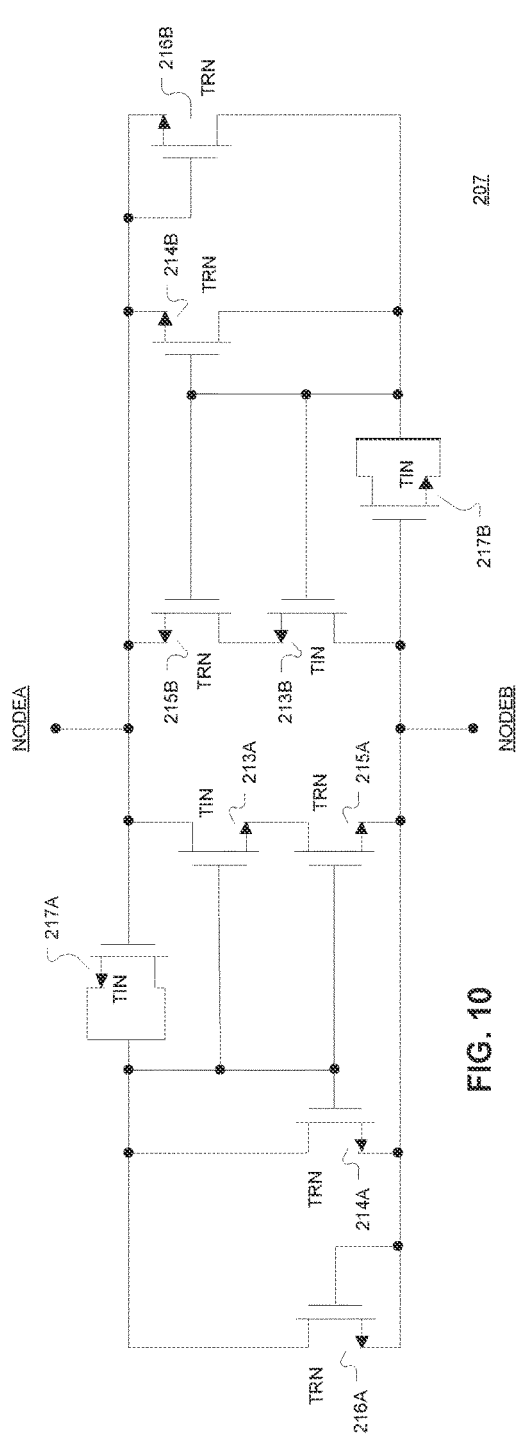
FIG. 10 is simplified diagram of a symmetrical active resistor according to various embodiments.

FIG. 10 is simplified diagram of a symmetrical active bias resistor (ABR) 207 according to various embodiments. The ABR 207 may be used in place of a large resistor to remove an AC component from the input signal and couple DC components of signals. In an embodiment, the ABR 207 is symmetrical and can operate in either direction. As shown in FIG. 10, an ABR 207 may include TIN 213A, 213B, TRN 214A, 214B, 215A, 215B, 216A, 216B, and TIN 217A, 217B. The TIN's 217A, 217B source and drain are coupled to effectively form a switchable capacitor. In an embodiment the TIN 213A, 213B may be about 1.4/0.5/mt=1, TRN 214A, 214B, 215A, 215B, 216A, 216B may be about 1.4/2/mt=1, and TIN 217A, 217B may also be about 1.4/2/mt=1.

In operation NODEA and NODEB may effectively switch operation as function of whether the voltage level of NODEB is less than or greater than the voltage level of NODEA. In an embodiment an ABR 207 may be used to bias a clock signal at a given DC bias. In this embodiment NODEA or NODEB is connected to a DC bias and the other of NODEA or NODEB is connected to a clock side. The clock side signal includes a capacitive coupled AC signal. For example, if an AC signal is coupled to NODEA and a DC bias is coupled to NODEB, then NODEA will have the same DC basis as NODEB. An ABR 207 may not affect the AC component of NODEA in the example, but only pass a DC component from a NODEB signal to NODEA. It is noted that the ABR 207 may very quickly track a DC bias between NODEA and NODEB given there is no RC time constant delay that may commonly exists when a resistor is employed to create a DC bias.

In operation when an AC signal on NODEA is rising and its potential is greater than NODEB the left side (A) of the ABR 207 is active or operates. However, when an AC signal on NODEA is falling and its potential is less than NODEB the right side (B) of the ABR 207 is active or operates. As noted 217A, 217B are capacitors. As NODEA rises displaced currents are passed to TRN 214A and the gates of TRN 215A, TIN 213A are also pulled up by the displacement current through the capacitor 217A. TIN 213A is optional in an embodiment and provides additional impedance if needed. In this example an AC path is present from NODEA to NODEB via 214A and 217A. A DC path is formed from 213A and 215A (from NODEA to NODEB). The DC path formed by TIN 213A and TRN 215A enables the ABR 207 to track DC bias changes quickly. The capacitance of 217A, 217B adjusts the current tracking rate.

In an embodiment the ABR 207 is only affected by the respective potential levels of NODEA and NODEB. When the NODEA potential falls below the NODEB potential, the diode 216A may operate to discharge the capacitor 217A (the diode 216A becomes forward biased). Accordingly it may be desirable to make the capacitance of 217A, 217B small to create small currents (losses) similar to a large resistor.

Figure 11B:
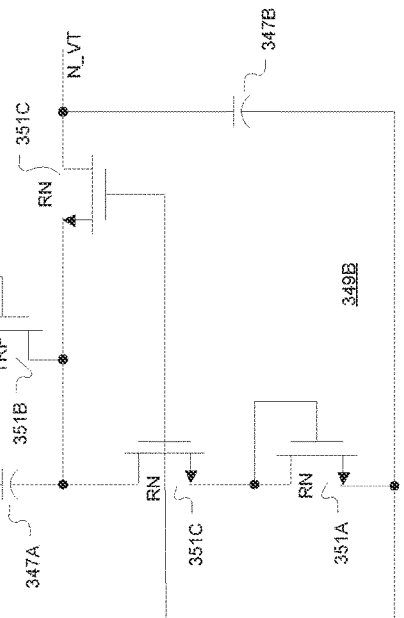
FIG. 11B is simplified diagram of a N-bias voltage tracker according to various embodiments.
Figure 11A:
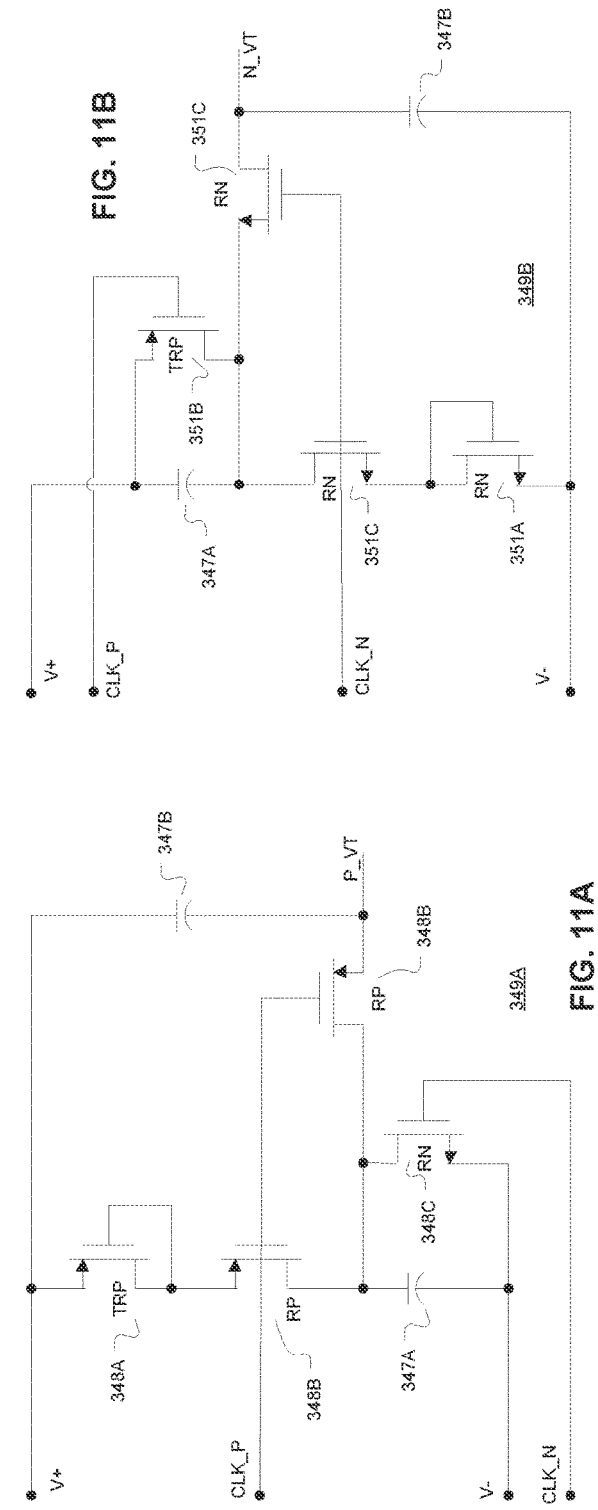
FIG. 11A is simplified diagram of a P-bias voltage tracker according to various embodiments.

FIG. 11A is simplified diagram of a P-bias voltage tracker (P-VT) 349A according to various embodiments. FIG. 11B is simplified diagram of an N-bias voltage tracker (N-VT) 349B according to various embodiments. The trackers 349A, 349B receive clock inputs CLK_N and CLK_P and act as a switched capacitor circuit that generates a DC offset from V+(P-VT) or V− (N-VT) equivalent to the threshold voltage of the respective diode connected FETs 348A, 351A.

As shown in FIG. 11A, P-VT 349A includes a TRP diode 348A, RP 348B, RN 348C, and capacitors 347A, 347B. The P-VT receives clock signals and passes a DC signal between V+ and V−. The capacitors 347A, 347B may be about 0.500/1.4/5.362fF/mp=1, 3.9/9/211.2fF/mp=1. TRP 348A, 348B may be about 1.4/0.5/mt=1, respectively. RN 348C may be about 1.4/0.8/mt=1. RN 351A, 351C may be about 5/0.8/mt=1, 1.4/0.5/mt=1, respectively. TRP 351B may be about 1.4/0.5/mt=1.

As shown in FIG. 11B, N-VT 349B includes an RN diode connected FET 351A, TRP 351B, RN 351C, and capacitors 347A, 347B. The N-VT receives clock signals and passes DC signal between V− and V+. The P-VT 349A and N-VT 349B operate as a diode. The remainder of the elements form switched capacitor elements to bias the respective diodes. In N-VT 349B the DC bias is equal to V− plus the threshold of diode 351A and in P-VT 349A, the DC bias is equal to V+ minus the threshold of diode 348A.

Figure 12:
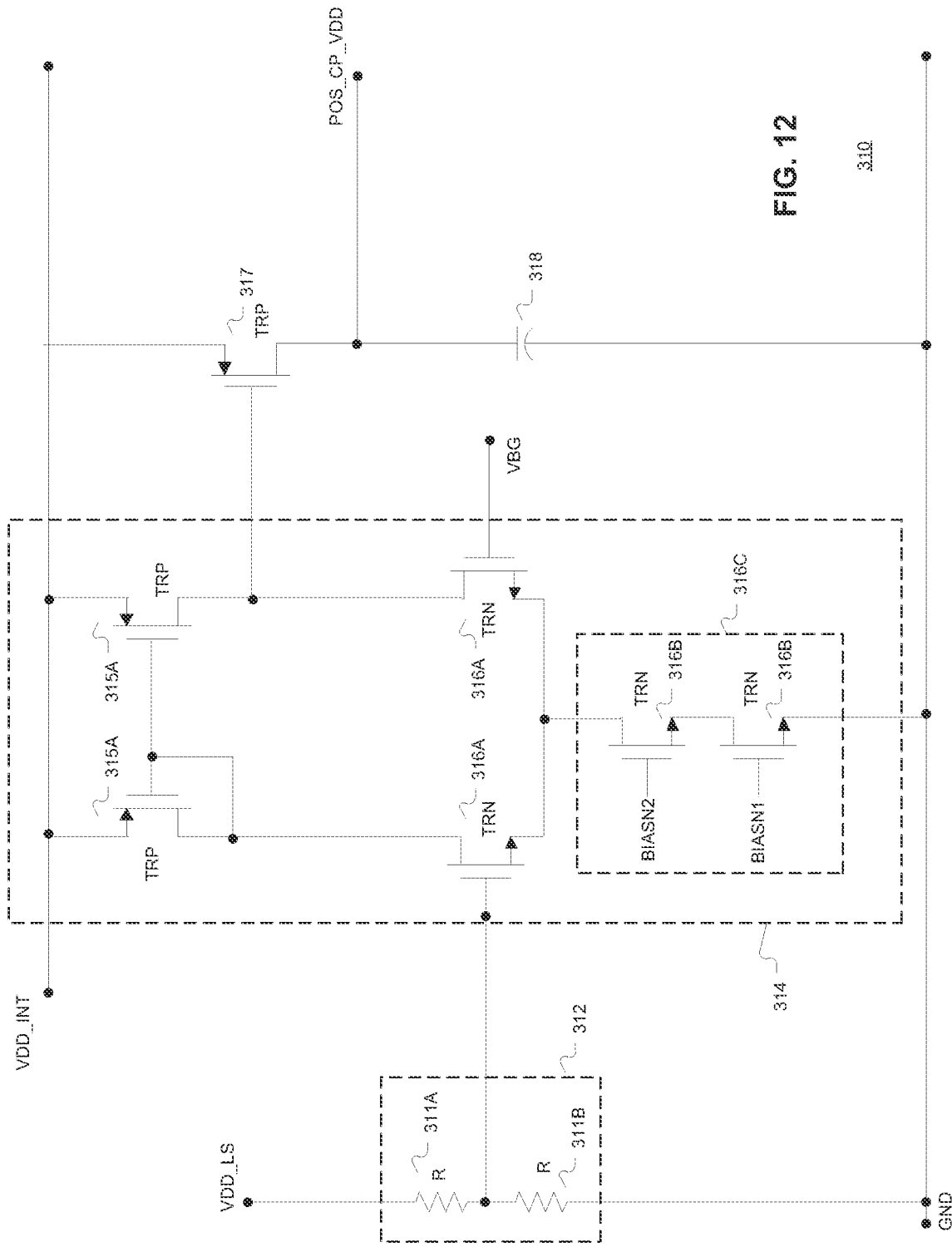
FIG. 12 is simplified diagram of a positive voltage control signal generation module (VCSGM) according to various embodiments.

FIG. 12 is simplified diagram of a positive voltage control signal generation module (VCSGM) 310 according to various embodiments. As shown in FIG. 12, the VCSGM 310 includes an OTA 314, a voltage divider 312, an LDO 317, and a capacitor 318. The OTA includes a CS-N (current sink) formed by TRN 316B pair and a differential amplifier formed by the TRP 315A pair and the TRN 316A pair. The OTA 314 may determine the difference between a reference signal VBG (the output of the BBSGM 100) and voltage divided VDD_LS. In an embodiment VDD_LS is about 3.4 V and VBG is about 1.16 V. The voltage divider 312 includes several resistors 311A, 311B where the resistance is selected to make the nominal value of VDD_LS about equal to VBG (ratio 1.16/3.4 in an embodiment).

In an embodiment the resistor 311A may have a total resistance of about 1074.96 Kohms and include at least three resistors in series about 13.4/1.4/49.96/ms=2, 13.4/1.4/499.6/ms=20, and 47.2/1.4/525.4/ms=6. The resistor 311B may have a total resistance of about 562.37 Kohms and include at least three resistors in series about 47.2/1.4/175.1/ms=2, 13.4/1.4/374.7/ms=15, and 3.3/1.4/6.278/ms=1. Accordingly the resistor divider may reduce the VDD_LS signal by about 65.65% (3.4 V reduced 65.65% equals about 1.16 V in an embodiment). The FET TRP 317 may be about 12/0.4/1. The capacitor 318 may be about 9.65/5.6/321.9F/mp=1. The FET TRP 315A, TRN 316A, and TRN 316B may be about 4/2/2, 4/2/2, and 8/2/1, respectively. The current sink 316C may draw about 2.4 uA in an embodiment.

The LDO (low drop out regulator) formed by the TRP 317 limits or sets a ceiling for the POS_CP_VDD control signal. In an embodiment the LDO TRP 317 drain can only be high as the source or supply or POS_CP_VDD voltage level can only be as great as the VDD_INT voltage level (or about 2.3 volts in an embodiment.) As noted below the PVCPGM 340 generates a signal VPOS having a voltage level twice the voltage level of POS_CP_VDD. Accordingly during a switching event the PVCPGM 340 VPOS signal voltage level may be twice the VDD_INT voltage level (or about 4.6 volts in an embodiment). Such configuration may enable the BBSGM 100 to recover more quickly after a switching event—lowering the potential insertion loss of the BBSGM 100. The capacitor 318 may stabilize the POS_CP_VDD signal in embodiment.

FIG. 13 is simplified diagram of a positive voltage charge pump generation module (PVCPGM) 340 according to various embodiments. As shown in FIG. 13, the PVCPGM 340 includes P-type voltage trackers (P-VT) 349A, N-type voltage trackers (N-VT) 349B, ABR 207, capacitors 341A, 341B, 341C upper inverter formed from TRP 353A pair and TRN 353B pair, and lower inverter formed from TRP 353C pair and TRN 353D pair. The capacitors 341A, 341B, 341C may be about 4.5/16.45/441fF/mp=1, 3.9/9.4/220.5fF/mp=1, 3.9/9.1/213.5fF/mp=1, respectively in an embodiment. The TRP 353A, 353C may be about 12/0.4/mt=1. The TRN 353B, 353D may be about 6/0.4/mt=1. The fly capacitors 302A, 302B may be about 30/30/5.226 pF/mp=1, in an embodiment.

The PVCPGM 340 receives the clock signals OSC1, OSC2, and voltage signal POS_CP_VDD and alternatively charges and discharges capacitors 302B, 302A, respectively to generate signal VPOS. In an embodiment the bottom plate of each capacitor 302A, 302B is at about 1.7 volts (POS_CP_VDD) when discharging, and 0V when charging. During a discharge phase the voltage at the capacitor 302A, 302B top plate may be about twice the bottom plate voltage level (as supplied by signal POS_CP_VDD (about 1.7 volts in an embodiment)) or about 3.4 volts in an embodiment. During the charging phase these top plates will be at about 1.7 volts (POS_CP_VDD). It is noted that the capacitors 302A, 302B may be MOS capacitors where the polarity of the connections is relevant. It is also noted that the PVCPGM may be fully symmetric and the clock signal OSC1, OSC2 may also be fully symmetric. As noted in FIG. 13 the P-type voltage tracker 349A DC basis signal B1A is shared by the differential pair 353A through ABR 207. Similarly, the N-type voltage tracker 349B DC basis signal B1B is shared by the differential pair 353B through ABR 207.

Similarly on bottom inverter formed from the FET pairs 353C, 353D, the P-type voltage tracker 349A DC basis signal B2A is shared by the differential pair 353C through ABR 207. Similarly, the N-type voltage tracker 349B DC basis signal B2B is shared by the differential pair 353D through ABR 207. As noted nominally the voltage level of VPOS is equal to twice the voltage level of POS_CP_VDD. In operation when an input signal on OSC1 is high and OSC2 is low, TRP 353A (right side), TRN 353B (left side), TRP 353C (left side), TRN 353D (right side) are turned on and TRP 353A (left side), TRN 353B (right side), TRP 353C (right side), TRN 353D (left side), are turned off. Similarly, when an input signal on OSC1 is low and OSC2 is high, the opposite is true. The respective capacitors 302A, 302B get charged to the level of POS_CP_VDD. Accordingly VPOS is equal to 2×POS_CP_VDD. In an embodiment the PVCPGM 340 is symmetrical so clock (DOM 200) sees a fully symmetric and differential load.

Figure 14A:
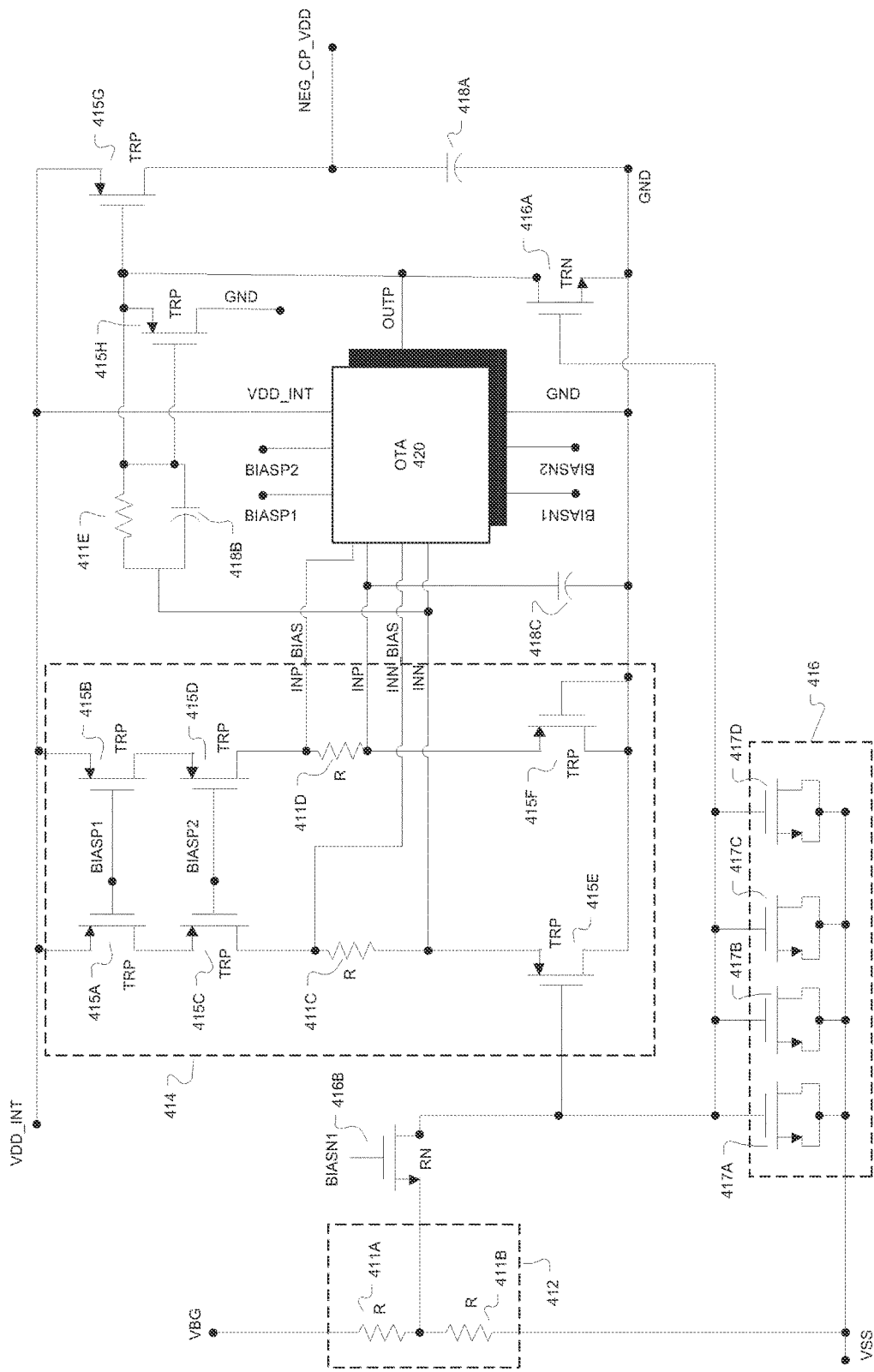
FIGS. 14A-14D are simplified diagrams of a negative voltage control signal generation module (NCSGM) 410 according to various embodiments and the various components.

FIGS. 14A-14D are simplified diagrams of a negative voltage control signal generation module (NCSGM) 410 according to various embodiments and the various components. FIG. 15 is simplified diagram of a negative voltage charge pump generation module (NVCPGM) 440 according to various embodiments. The NCSGM 410 and NVCPGM 440 is described in co-pending, commonly assigned application PER-027-PCT, entitled, "LOW-NOISE HIGH EFFICIENCY BIAS GENERATION CIRCUITS AND METHOD", filed Jul. 17, 2009 and assigned to application number PCT/US2009/004149. As shown in FIG. 14A, the VCSGM 310 includes a buffer 414, a voltage divider 412, an OTA 420, a capacitor bank 416, capacitors 418A, 418B, 418C, a TRP (P-Type FETs) LDO 415G, N-type FETs 416A and 416B, and a resistors 411A-E. The buffer 414 includes a CS-P (current source) pair formed by pair of TRP 415A, 415C pair and TRP 415B, 415D pair and TRP 415E and TRP 415F matched pair.

In an embodiment the resistor 411A may have a total resistance of about 587.53 Kohms and include at least three resistors in series about 6.7/1.4/12.57/ms=1, 13.4/1.4/49.96/ms=2, and 94.4/1.4/525/ms=3. The resistor 411B may have a total resistance of about 1700.87 Kohms and include at least three resistors in series about 94.4/1.4/1575/ms=6, 13.5/1.4/100.7/ms=4, and 13.5/1.4/25.17/ms=1. The FETs TRP 415A, 415B, 415C, 415D, 415E, 415F may be about 8/4/2 in an embodiment. The FETs TRP 415G, 415H may be about 4/0.4/1 and 4/1/1, respectively. The FET TRN 416A, 416B may be about 4/1/1 in an embodiment. The FET TRN 417A, 417B, and 417C may be about 20/10/1, and 10/10/1, respectively. The capacitors 418A, 418B, and 418C may be about 7/7/292fF/mp=1, 3/5.3/97.39fF/1, and 4/9.6/230.7fF/1, respectively. The resistors 411C, 411D, and 411E may be about 62.6/1.4/232.2/ms=2, 62.6/1.4/232.2/ms=2, and 28.3/1.4/630.8/ms=12, respectively.

The capacitor bank 416 may include four TIN type capacitors 418A, 418B, 418C, and 418D. The capacitors 418A, 418B, 418C, and 418D may be about 20/19.2/mt=1, 10/10/mt=1, and 5/10/mt=1, respectively. The increased capacitor bank 416 may reduce the settling time of the signal VSS after a switching event. The switch 416B may also prevent the capacitor bank 416 from discharging or limits its discharge during a switching event. The switch 416B may also help reduce the settling time of the signal VSS after a switching event.

Figure 14B:
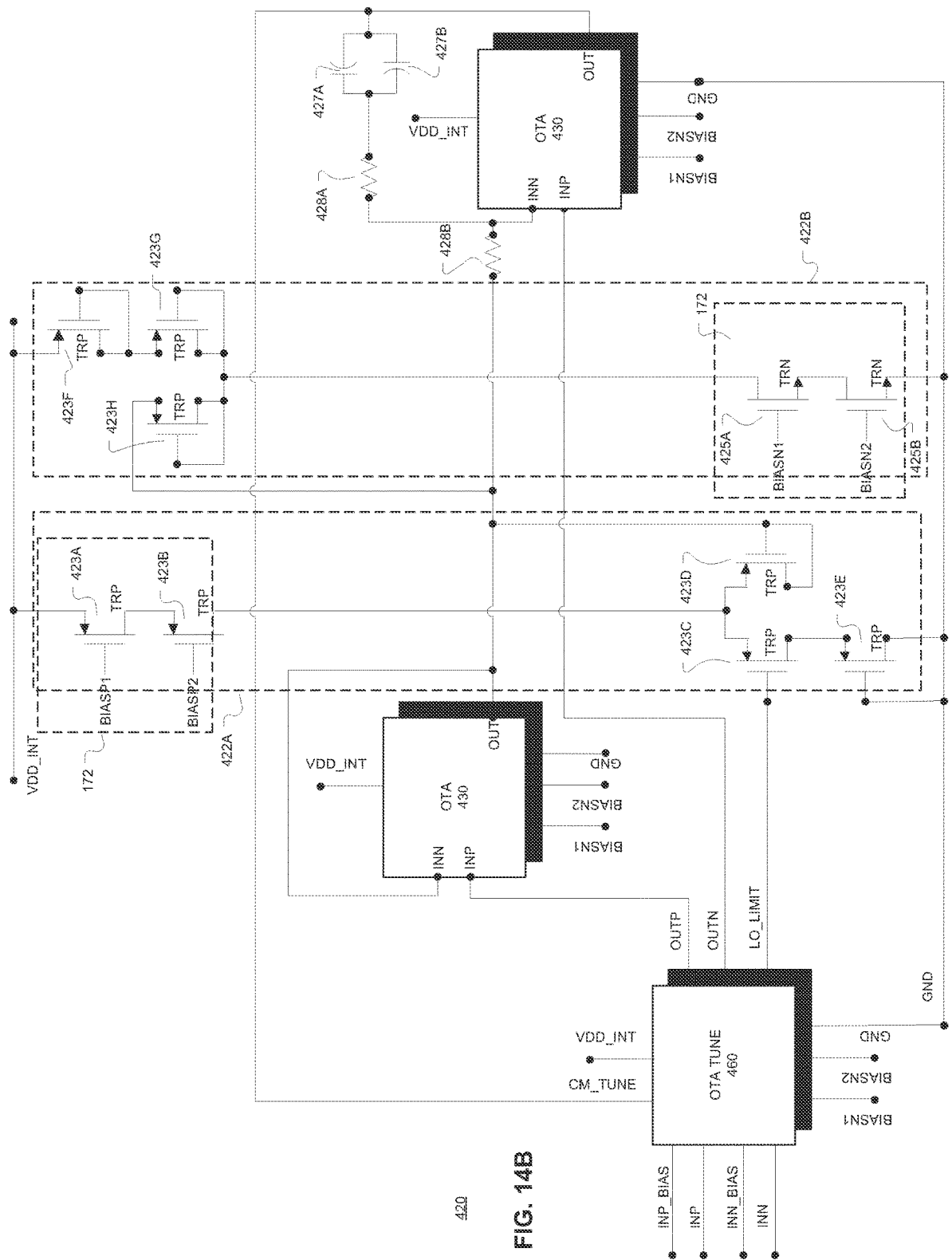
Figure 15:
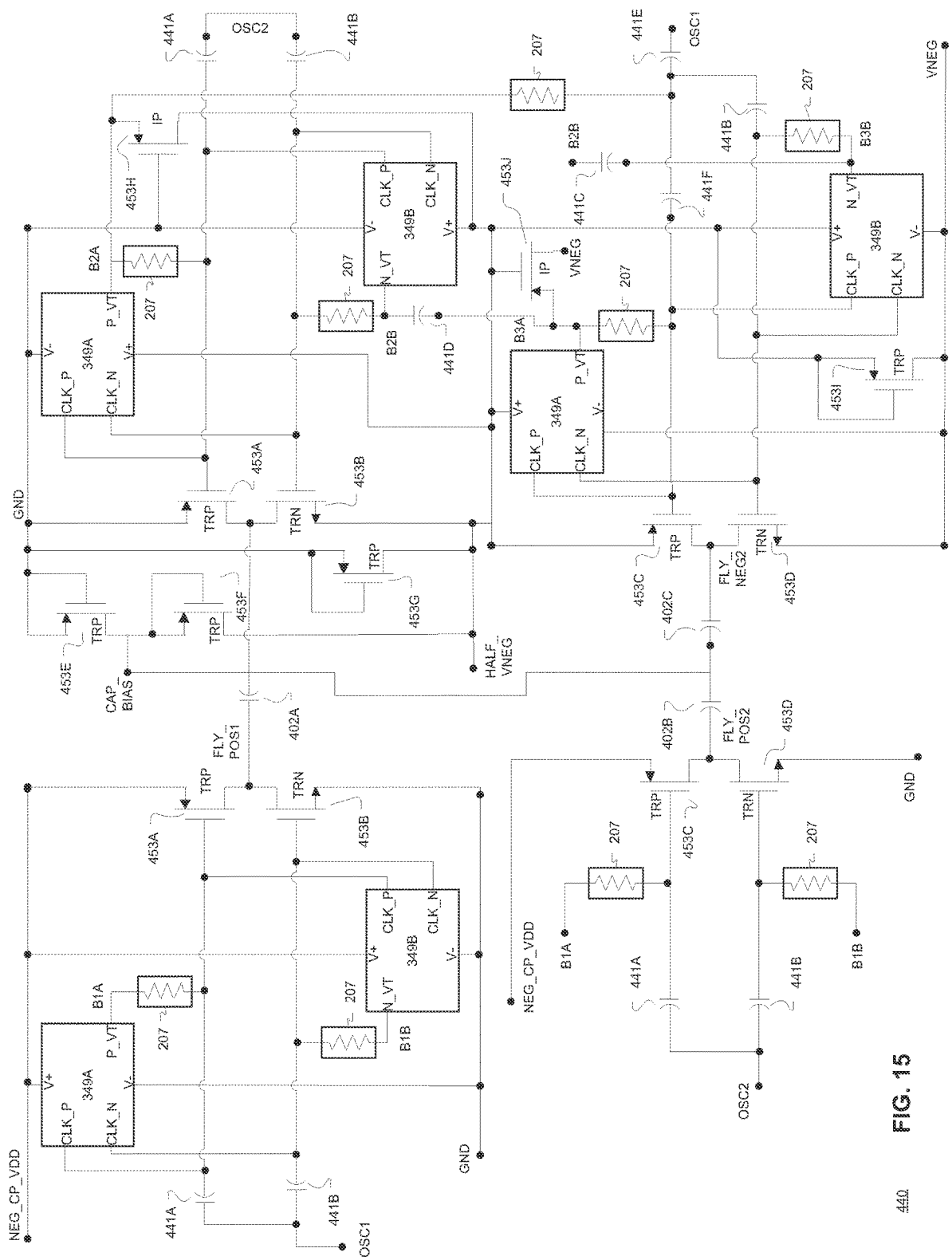
FIG. 15 is simplified diagram of a negative voltage charge pump generation module (NVCPGM) 440 according to various embodiments.

FIG. 14B is a simplified diagram of an OTA 420 according to various embodiments and the various components that may be employed in the NCSGM 410 shown in FIG. 14A. As shown in FIG. 14B, the OTA 420 may include an OTA Tune 460, two OTA 430, a clamp 422A, a clamp 422B, capacitors 427A, 427B, and resistors 428A and 428B. The clamp 422A includes a CS-P (current source) 142 including a FET TRP pair 423A, 423B, a buffer formed by TRP 423C, and diode connected FETs TRP 423D and 423E. The clamp 422B includes a CS-N (current sink) 172 including a FET TRN pair 425A, 425B, a buffer formed by TRP 423G, and diode connected FETs TRP 423F and 423H.

The FETs TRP 423A, 423B may be about 4/2/1 so the CS-P 142 may provide about 1.2 uA of current in an embodiment. The FETs TRP 423C, 423D, 423H, 423G may be about 4/1.8/1 in an embodiment. The FETs TRP 423E, 423F may be about 4/0.4/1 in an embodiment. The capacitors 427A, 427B may be about 10.5/4.9/307.1fF/mp+1. The resistors 428A and 428B may be about 26.9/1.4/99.96/ms=2 and 26.9/1.4/199.9/ms=4, respectively.

Figure 14C:
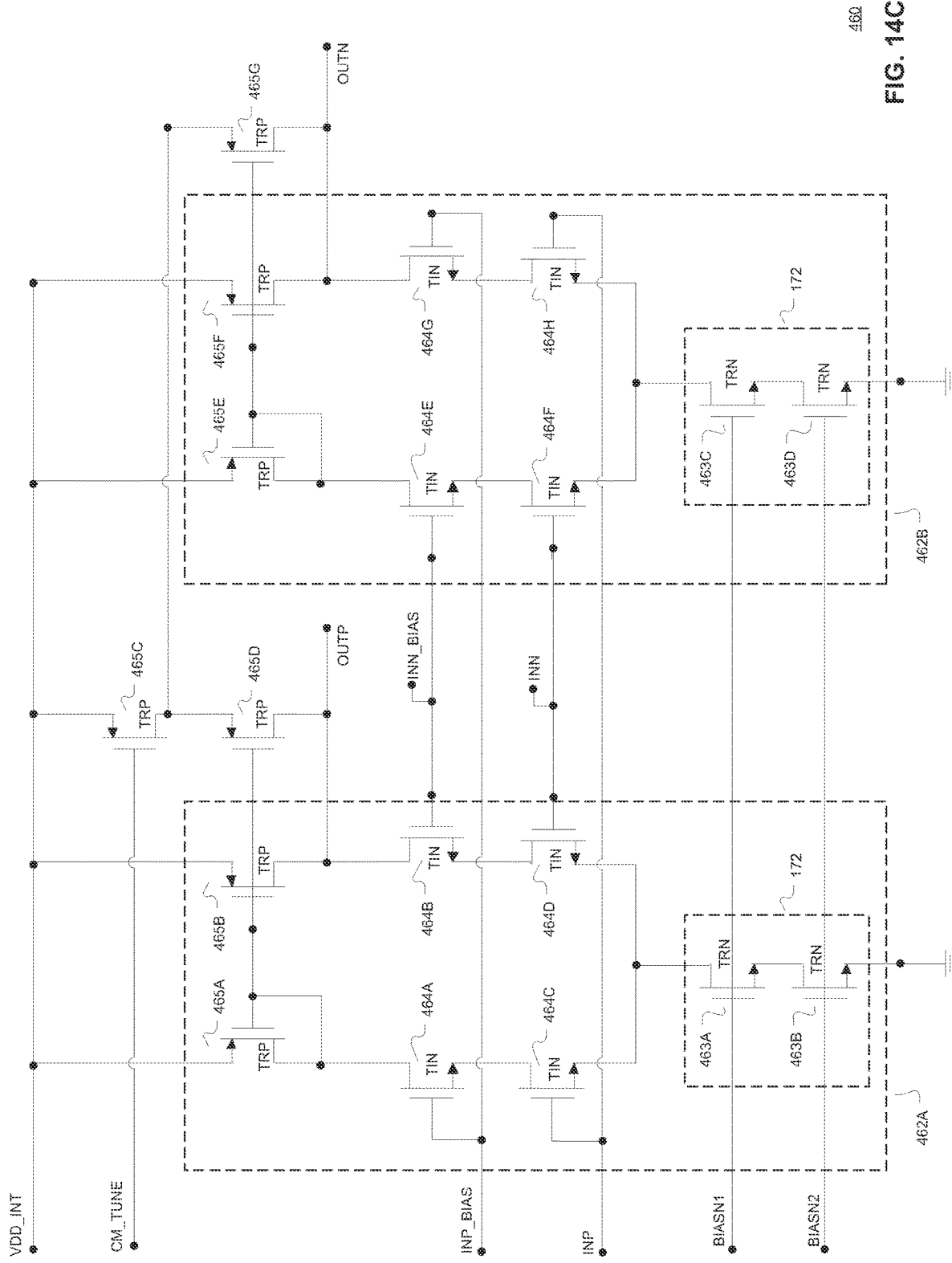

FIG. 14C is a simplified diagram of an OTA Tune 460 according to various embodiments and the various components that may be employed in the OTA 420 shown in FIG. 14B. As shown in FIG. 14C, the OTA Tune 460 may include a first differential OTA 462A, a second differential OTA 462B, a TRP pair 465C, 465D, and a TRP 465G. The first differential OTA 462A may include a CS-N (current sink) 172 including a FET TRN pair 463A, 463B (and receiving the gate bias signals BIASN1, BIASN2), and amplifier formed by TRP pair 465A, 465B, TIN pair 464A, 464B, and a TIN pair 464C, 464D. The second differential OTA 462B may include a CS-N (current sink) 172 including a FET TRN pair 463C, 463D (and receiving the gate bias signals BIASN1, BIASN2), and an amplifier formed by TRP pair 465E, 465F, TIN pair 464E, 464G, and a TIN pair 464F, 464H.

Both differential OTAs 462A, 462B compare the signals INP_BIAS and INN_BIAS and INP and INN in opposite polarities. The first differential OTA 462A generates the signal OUTP having a floor controlled by CM_TUNE and the TRP pair 465C, 465D. The second differential OTA 462B generates the signal OUTN having a floor controlled by CM_TUNE and the TRP 465C and 465G. The FETs TRN 463A, 463B, 463C, 463D may be about 8/2/1 so each two CS-N 172 may draw about 2.4 uA of current in an embodiment. The FETs TIN 464C, 464D, 464F, 464H may be about 4/2/2 in an embodiment. The FETs TIN 464A, 464B, 464E, 464G may be about 4/1/1 in an embodiment. The FETs TRP 465A, 465E may be about 4/1/2 in an embodiment. The FETs TRP 465B, 465F may be about 4/1/1 in an embodiment. The FETs TRP 465D, 465G may be about 4/1/3 in an embodiment. The FET TRP 465C may be about 4/0.5/1 in an embodiment.

Figure 14D:
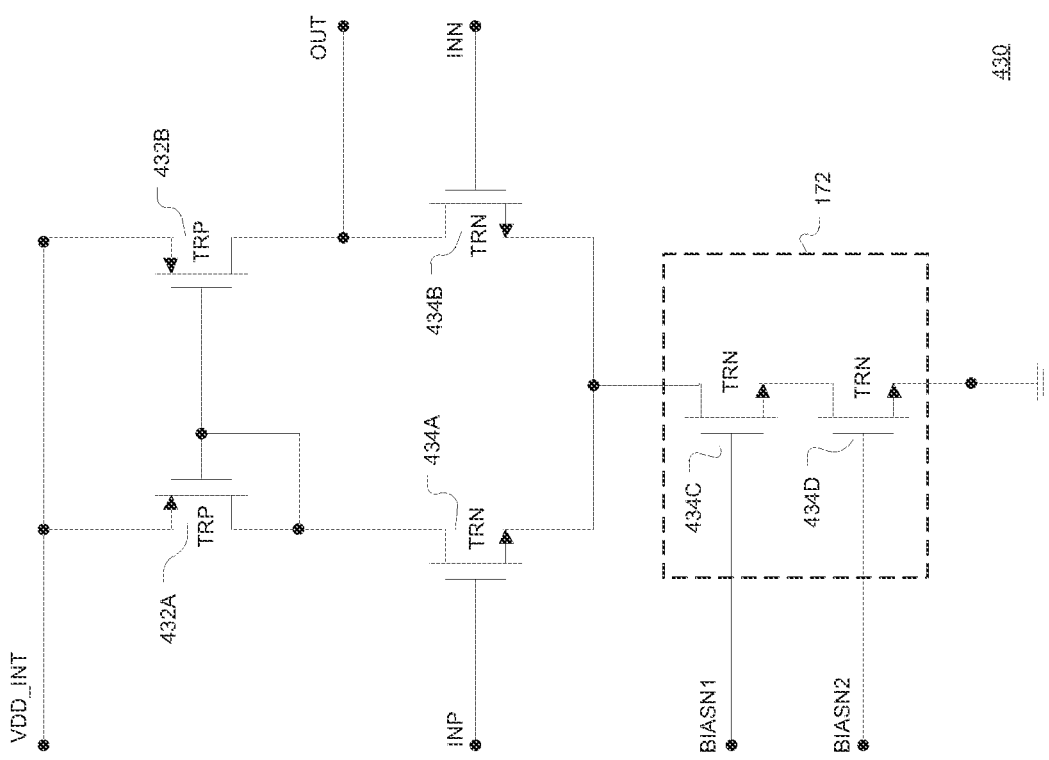

FIG. 14D is a simplified diagram of an OTA 430 according to various embodiments and the various components that may be employed in the OTA 420 shown in FIG. 14B. As shown in FIG. 14D, the OTA 430 may be a differential OTA and include a CS-N (current sink) 172 including a FET TRN pair 434C, 434D (and receiving the gate bias signals BIASN1, BIASN2), and an amplifier formed by TRP pair 432A, 432B, and a TRN pair 434A, 434B. The differential OTA 430 may compare the signals INP and INN and generate the signal OUT based on said differential. The FETs TRN 434C, 434D may be about 4/2/1 so the CS-N 172 may draw about 1.2 uA of current in an embodiment. The FETs TRN 434A, 434B may be about 4/2/1 in an embodiment. The FETs TRP 432A, 432B may be about 4/2/1 in an embodiment.

FIG. 15 is simplified diagram of a negative voltage charge pump generation module (NVCPGM) 440 according to various embodiments. As shown in FIG. 15, the NVCPGM 440 includes P-type voltage trackers (P-VT) 349A, N-type voltage trackers (N-VT) 349B, ABR 207, capacitors 441A, 441B, 441C, 441D, 441E, 441F, upper inverter formed from TRP 453A pair and TRN 453B pair, lower inverter formed from TRP 453C pair and TRN 453D pair, TRP 453E, 453F, 453G, 453I, IP 453H, 453J. External fly capacitors 402A, 402B, and 403C are coupled to the inverters. In an embodiment the capacitors 441A, 441B, 441C, 441D, 441E, 441F may be about 10/12/706.6fF/mp=1, 6.9/6/247.5F/mp=1, 6.9/6/247.5fF/mp=1, 14.8/12/2.084 pF/mp=2, and 9.65/12/1.364 pF/mp=2, respectively in an embodiment. The TRP 453A, 453C may be about 20/0.35/mt=1. The TRN 453B, 453D may be about 10/0.35/mt=1. The fly capacitors 402A, 402B, 402C may be about 30/30/5.226 pF/mp=1, in an embodiment. The TRP 453E, 453F, 453G, 453I may be about 1.4/0.8/mt=1. The IP 453H, 453J may be about 1.4/0.8/mt=1 in an embodiment.

The NVCPGM 440 receives the clock signals OSC1, OSC2, and voltage signal NEG_CP_VDD and alternatively charges and discharges capacitors 402A and 402B, 402C pair, respectively to generate signal VNEG. In operation, when an input signal on OSC1 is high and OSC2 is low, TRN 453B (left side), 453D (right side), TRP 453A (right side), 453C (left side), are turned on and TRN 453B (right side), 453D (left side), TRP 453A (left side), 453C (right side) are turned off. Similarly, when an input signal on OSC1 is low and OSC2 is high, everything is reversed. The capacitors 402A, 402B and 402C get charged to the level of NEG_CP_VDD. Accordingly VNEG is equal to −(2× NEG_CP_VDD) or about −3.4 Volts in an embodiment. In an embodiment the NVCPGM 440 is symmetrical so clock (DOM 200) sees a fully symmetric and differential load.

The length of the FET TRP 453A, 453C and TRN 453B, 453D may be about versus 0.4 um in another embodiment to reduce the drop across these devices. In an embodiment the capacitor 402A may include 10 coupled 30/30/5.226 pF/mp=1 capacitors, the capacitor 402B may include 8 coupled 30/30/5.226 pF/mp=1 capacitors, and the capacitor 402C may include 8 coupled 30/30/5.226 pF/mp=1. In another embodiment the embodiment the capacitor 402A may include 4 coupled 30/30/5.226p/mp=1 capacitors, the capacitor 402B may include 4 coupled 30/30/5.226 pF/mp=1 capacitors, and the capacitor 402C may include 4 coupled 30/30/5.226p/mp=1. Such configurations may reduce the VSS settling time after a switching event.

| Reference Table for Specification: | |
|---|---|
| BSGA | Bias Signal Generation Architecture 10 |
| BBSGM | Base Bias Signal Generation Module 100 |
| DOM | Differential Oscillator Module 200 |
| PVCPM | Positive Voltage Charge Pump Module 300 |
| NVCPM | Negative Voltage Charge Pump Module 400 |
| PVCM | Positive Voltage Clamping Module 15 |
| NVCM | Negative Voltage Clamping Module 17 |
| PSM | Power Supply Module 18 |
| VRM | Voltage Regulator Module 110 |
| BRM | Bandgap Reference Module 140 |
| RVCGM | Reference Voltage and Current Generator Module 170 |
| SSM | Startup and Standby Module 190 |
| VDD | External power supply signal |
| VDD_LS | Positive Voltage Supply |
| VNEG | Negative Voltage Supply |
| GND | Ground |
| BIASP1 | Bias Signal 1 for P-type devices |
| BIASP2 | Bias Signal 2 for P-type devices |
| BIASN1 | Bias Signal 1 for N-type devices |
| BIASN2 | Bias Signal 2 for N-type devices |
| VBG | Bandgap voltage reference signal |
| HKP | Harmonic Knee Point |
| FET | field-effect transistor |
| CS_P | current source P-type |
| CS_N | current sink N-type |
| OPAMP | operational amplifiers |
| OTA | operational trans-conductance amplifiers |
| POS_CP_VDD | positive charge pump control signal |
| NEG_CP_VDD | negative charge pump control signal |
| LDO | low drop out |
| TIN | thicker film intrinsic N-type FET |
| IN | intrinsic N-type FET |
| TRP | thicker film regular type P-type FET |
| TRN | thicker film regular type N-type FET |
| RP | regular type P-type FET |
| RN | regular type N-type FET |
| IREF | reference current |
| IVREF | reference voltage based on reference current |
| CBVGM | current/bias voltage generation module 192 |
| ABR | active bias resistor 207 |
| VCSGM | positive voltage control signal generation module 310 |
| PVCPGM | positive voltage charge pump generation module 340 |
| NCSGM | negative control signal generation module 410 |
| NVCPGM | negative voltage charge pump generation module 440 |
| P_VT | P-type voltage tracker 349A |
| N_VT | N-type voltage tracker 349B |

The apparatus and systems of various embodiments may be useful in applications other than a sales architecture configuration. They are not intended to serve as a complete description of all the elements and features of apparatus and systems that might make use of the structures described herein. It is noted that the bias signal generation architecture ("B SGA") 10 may be formed in whole or part on silicon on insulator (SOI) wafer(s) including silicon on sapphire (SOS) according to various embodiments. Any or all of the base bias signal generator module ("BBSGM") 100, the differential oscillator module ("DOM") 200, the positive voltage charge pump module ("PVCPM") 300, the negative voltage charge pump module ("NVCPM") 400, the positive voltage clamping module ("PVCM") 15, the negative voltage clamping module ("NVCM") 17, and the switching module 22 may be formed in whole or part on silicon on insulator (SOI) wafer(s) including silicon on sapphire (SOS) according to various embodiments.

Applications that may include the novel apparatus and systems of various embodiments include electronic circuitry used in high-speed computers, communication and signal processing circuitry, modems, single or multi-processor modules, single or multiple embedded processors, data switches, and application-specific modules, including multilayer, multi-chip modules. Such apparatus and systems may further be included as sub-components within a variety of electronic systems, such as televisions, cellular telephones, personal computers (e.g., laptop computers, desktop computers, handheld computers, tablet computers, etc.), workstations, radios, video players, audio players (e.g., mp3 players), vehicles, medical devices (e.g., heart monitor, blood pressure monitor, etc.) and others. Some embodiments may include a number of methods.

It may be possible to execute the activities described herein in an order other than the order described. Various activities described with respect to the methods identified herein can be executed in repetitive, serial, or parallel fashion.

A software program may be launched from a computer-readable medium in a computer-based system to execute functions defined in the software program. Various programming languages may be employed to create software programs designed to implement and perform the methods disclosed herein. The programs may be structured in an object-orientated format using an object-oriented language such as Java or C++. Alternatively, the programs may be structured in a procedure-orientated format using a procedural language, such as assembly or C. The software components may communicate using a number of mechanisms well known to those skilled in the art, such as application program interfaces or inter-process communication techniques, including remote procedure calls. The teachings of various embodiments are not limited to any particular programming language or environment.

The accompanying drawings that form a part hereof show, by way of illustration and not of limitation, specific embodiments in which the subject matter may be practiced. The embodiments illustrated are described in sufficient detail to enable those skilled in the art to practice the teachings disclosed herein. Other embodiments may be utilized and derived there-from, such that structural and logical substitutions and changes may be made without departing from the scope of this disclosure. This Detailed Description, therefore, is not to be taken in a limiting sense, and the scope of various embodiments is defined only by the appended claims, along with the full range of equivalents to which such claims are entitled.

Such embodiments of the inventive subject matter may be referred to herein individually or collectively by the term "invention" merely for convenience and without intending to voluntarily limit the scope of this application to any single invention or inventive concept, if more than one is in fact disclosed. Thus, although specific embodiments have been illustrated and described herein, any arrangement calculated to achieve the same purpose may be substituted for the specific embodiments shown. This disclosure is intended to cover any and all adaptations or variations of various embodiments. Combinations of the above embodiments, and other embodiments not specifically described herein, will be apparent to those of skill in the art upon reviewing the above description.

The Abstract of the Disclosure is provided to comply with 37 C.F.R. § 1.72(b), requiring an abstract that will allow the reader to quickly ascertain the nature of the technical disclosure. It is submitted with the understanding that it will not be used to interpret or limit the scope or meaning of the claims. In the foregoing Detailed Description, various features are grouped together in a single embodiment for the purpose of streamlining the disclosure. This method of disclosure is not to be interpreted to require more features than are expressly recited in each claim. Rather, inventive subject matter may be found in less than all features of a single disclosed embodiment. Thus the following claims are hereby incorporated into the Detailed Description, with each claim standing on its own as a separate embodiment.

What is claimed is:

1. A system comprising:
    a bias signal generator configured to generate a reference voltage signal based at least in part on a supply voltage signal;
    a first charge pump configured to generate a positive voltage signal and maintain a voltage level of the positive voltage signal during a switching event, wherein the first charge pump comprises a first charge pump capacitor, wherein the first charge pump is configured to employ the first charge pump capacitor to generate a portion of the positive voltage signal based at least in part on the reference voltage signal, wherein the reference voltage signal has a voltage level that is less than the voltage level of the positive voltage signal; and
    at least one radio frequency (RF) switch configured to receive the positive voltage signal and perform the switching event.

2. The system of claim 1, further comprising a second charge pump configured to generate a negative voltage signal and maintain a voltage level of the negative voltage signal during the switching event, wherein the second charge pump comprises a second charge pump capacitor, wherein the second charge pump is configured to employ the second charge pump capacitor to generate a portion of the negative voltage signal based at least in part on the reference voltage signal, and wherein the at least one RF switch is configured to receive the negative voltage signal.

3. The system of claim 2, wherein the negative voltage signal is a negative rail voltage signal having a voltage level maintained by the second charge pump during the switching event.

4. The system of claim 3, wherein the at least one RF switch is configured to:
    receive the negative rail voltage signal at a first port of the at least one RF switch;
    receive an input signal at a second port of the at least one RF switch; and
    provide, based on the switching event, an output signal at a third port of the at least one RF switch.

5. The system of claim 1, wherein the positive voltage signal is a positive rail voltage signal having a voltage level maintained by the first charge pump during the switching event.

6. The system of claim 5, wherein the at least one RF switch is configured to:
    receive the positive rail voltage signal at a first port of the at least one RF switch;
    receive an input signal at a second port of the at least one RF switch;
    perform the switching event based on the positive rail voltage signal; and
    provide, based on the switching event, an output signal at a third port of the at least one RF switch.

7. The system of claim 1, wherein the bias signal generator comprises a bandgap reference generator configured to generate at least a portion of the reference voltage signal based on the supply voltage signal.

8. The system of claim 1, wherein the at least one RF switch is configured to:
receive the positive voltage signal at a first port of the at least one RF switch;
receive an input signal at a second port of the at least one RF switch;
perform the switching event based on the positive voltage signal; and
provide, based on the switching event, an output signal at a third port of the at least one RF switch.

9. The system of claim 1, wherein the at least one RF switch is configured to be driven based on the positive voltage signal.

10. The system of claim 1, wherein the first charge pump comprises a low dropout (LDO) regulator configured to provide a charge pump control signal based at least in part on the reference voltage signal, and wherein the first charge pump is configured to employ the first charge pump capacitor to generate the portion of the positive voltage signal based at least in part on the charge pump control signal.

11. The system of claim 1, wherein the first charge pump further comprises a second charge pump capacitor, wherein the first charge pump is configured to employ the second charge pump capacitor to generate another portion of the positive voltage signal based at least in part on the reference voltage signal.

12. The system of claim 1, further comprising an oscillator configured to generate a first clock signal, wherein the first charge pump is configured to generate the positive voltage signal further based at least in part on the first clock signal.

13. The system of claim 12, wherein the oscillator is further configured to generate a second clock signal, wherein the first charge pump is configured to generate the positive voltage signal further based at least in part on the second clock signal, and wherein the first clock signal and the second clock signal form a differential pair of clock signals.

14. The system of claim 1, wherein the first charge pump further comprises a voltage clamp configured to maintain the voltage level of the positive voltage signal during the switching event.

15. A method comprising:
generating a reference voltage signal based at least in part on a supply voltage signal;
generating, by a first charge pump, a positive voltage signal, wherein the generating the positive voltage signal comprises employing a first charge pump capacitor of the first charge pump to generate a portion of the positive voltage signal based at least in part on the reference voltage signal, wherein the reference voltage signal has a voltage level that is less than a voltage level of the positive voltage signal;
maintaining, by the first charge pump, the voltage level of the positive voltage signal during a switching event;
receiving, by at least one radio frequency (RF) switch, the positive voltage signal; and
performing, by the at least one RF switch, the switching event.

16. The method of claim 15, wherein the positive voltage signal is received at a first port of the at least one RF switch, wherein the switching event is performed based on the positive voltage signal, the method further comprising:
receiving an input signal at a second port of the at least one RF switch; and
providing, based on the switching event, an output signal at a third port of the at least one RF switch.

17. The method of claim 15, further comprising:
generating, by a second charge pump, a negative voltage signal, wherein the generating the negative voltage signal comprises employing a charge pump capacitor of the second charge pump to generate a portion of the negative voltage signal based at least in part on the reference voltage signal; and
maintaining, by the second charge pump, a voltage level of the negative voltage signal during the switching event.

18. The method of claim 17, wherein the positive voltage signal is a positive rail voltage signal having a voltage level maintained by the first charge pump during the switching event, and wherein the negative voltage signal is a negative rail voltage signal having a voltage level maintained by the second charge pump during the switching event.

19. The method of claim 18, wherein the positive rail voltage signal is received at a first port of the at least one RF switch, wherein the switching event is performed based on the positive rail voltage signal, the method further comprising:
receiving an input signal at a second port of the at least one RF switch; and
providing, based on the switching event, an output signal at a third port of the at least one RF switch.

20. The method of claim 15, further comprising driving, based on the positive voltage signal, the at least one RF switch.

21. The method of claim 15, further comprising providing, by a low dropout (LDO) regulator, a charge pump control signal based at least in part on the reference voltage signal, wherein the generating the positive voltage signal comprises employing the first charge pump capacitor of the first charge pump to generate the portion of the positive voltage signal based at least in part on the charge pump control signal.

22. The method of claim 15, further comprising generating a differential pair of clock signals, wherein the generating the positive voltage signal further comprises employing a second charge pump capacitor of the first charge pump to generate another portion of the positive voltage signal based at least in part on the reference voltage signal and the differential pair of clock signals.

23. A system comprising:
means for generating a reference voltage signal based on a supply voltage signal;
means for generating a positive voltage signal comprising means for employing a first charge pump capacitor to generate a portion of the positive voltage signal based at least in part on the reference voltage signal, wherein the reference voltage signal has a voltage level that is less than a voltage level of the positive voltage signal;
means for maintaining the voltage level of the positive voltage signal during a switching event;
means for receiving the positive voltage signal; and
means for performing the switching event.

24. The system of claim 23, further comprising:
means for receiving an input signal; and
means for providing an output signal based on the switching event.

25. The system of claim 23, further comprising:
means for generating a negative voltage signal comprising means for employing a second charge pump capacitor to generate a portion of the negative voltage signal based on the reference voltage signal; and means for maintaining a voltage level of the negative voltage signal during the switching event.

26. The system of claim 25, wherein the positive voltage signal is a positive rail voltage signal having a voltage level maintained during the switching event, wherein the negative voltage signal is a negative rail voltage signal having a voltage level maintained during the switching event, wherein the means for receiving the positive voltage signal comprises means for receiving the positive rail voltage signal, the system further comprising:
 means for receiving the negative rail voltage signal;
 means for receiving an input signal; and
 means for providing an output signal based on the switching event.

27. The system of claim 23, further comprising:
 means for generating one or more clock signals;
 means for generating a negative voltage signal comprising means for employing a second charge pump capacitor to generate a portion of the negative voltage signal based on the reference voltage signal and the one or more clock signals;
 means for maintaining a voltage level of the negative voltage signal during the switching event;
 means for providing a charge pump control signal based on the reference voltage signal,
 wherein:
  the means for employing the first charge pump capacitor comprises means for employing the first charge pump capacitor to generate the portion of the positive voltage signal based on the charge pump control signal and the one or more clock signals; and
  the means for generating the positive voltage signal further comprises means for employing a third charge pump capacitor to generate another portion of the positive voltage signal based on the charge pump control signal and the one or more clock signals.

28. The system of claim 23, wherein the positive voltage signal is a positive rail voltage signal, and wherein the system further comprises means for driving, based on the positive rail voltage signal, a radio frequency (RF) switch.

\* \* \* \* \*

UNITED STATES PATENT AND TRADEMARK OFFICE
CERTIFICATE OF CORRECTION

PATENT NO. : 12,242,293 B2
APPLICATION NO. : 18/322181
DATED : March 4, 2025
INVENTOR(S) : Tae Youn Kim and Robert Mark Englekirk It is certified that error appears in the above-identified patent and that said Letters Patent is hereby corrected as shown below:

In the Specification

In the RELATED APPLICATIONS:

Column 1, Line 8 change "U.S. patent application Ser. No." to --U.S. Patent Application No.--.

Column 1, Line 11 change "application Ser. No." to --Application No.--.

Column 1, Line 12 change "U.S. patent application Ser. No." to --U.S. Patent Application No.--.

Column 1, Line 15 change "application Ser. No." to --Application No.--.

Column 1, Line 16 change "U.S. patent application Ser. No." to --U.S. Patent Application No.--.

Column 1, Line 19 change "application Ser. No." to --Application No.--.

Column 1, Line 20 change "U.S. patent application Ser. No." to --U.S. Patent Application No.--.

Column 1, Line 23 change "application Ser. No." to --Application No.--.

Column 1, Line 24 change "U.S. patent application Ser. No." to --U.S. Patent Application No.--.

Column 1, Line 27 change "application Ser. No." to --Application No.--.

Column 1, Line 28 change "U.S. patent application Ser. No." to --U.S. Patent Application No.--.

Column 1, Lines 30-31 change "application Ser. No." to --Application No.--.

Column 1, Line 32 change "U.S. patent application Ser. No." to --U.S. Patent Application No.--.

Signed and Sealed this
Twenty-second Day of April, 2025

Coke Morgan Stewart
*Acting Director of the United States Patent and Trademark Office*

CERTIFICATE OF CORRECTION (continued)
U.S. Pat. No. 12,242,293 B2

Column 1, Line 35 change "application Ser. No." to --Application No.--.

Column 1, Line 42 change "U.S. patent application Ser. No." to --U.S. Patent Application No.--.

Column 1, Lines 45-46 change "U.S. patent application Ser. No." to --U.S. Patent Application No.--.

In the DETAILED DESCRIPTION:

Column 4, Line 35 change "by BBS GM 100" to --by BBSGM 100--.

Column 7, Lines 55-56 change "about 9.5/1.4/35.52/ms=2 and respectively" to --about 9.5/1.4/35.52/ms=2 and 50.9/1.4/377.7/ms=4, respectively.--.

Column 14, Line 6 change "about 1.4/0.5/mt=1, respectively." to --about 5/0.5/mt=1, 1.4/0.5/mt=1, respectively.--.

Column 16, Lines 10-11 change "about 20/10/1, and 10/10/1, respectively." to --about 20/19.2/1, 20/10/1, and 10/10/1, respectively.--.

Column 16, Lines 18-19 change "about 20/19.2/mt=1, 10/10/mt=1, and 5/10 mt=1, respectively." to --about 20/19.2/mt=1, 20/10/mt=1, 10/10/mt=1, and 5/10/mt=1, respectively.--.

Column 16, Line 43 change "about 10.5/4.9/307.1fF/mp+1." to --about 10.5/4.9/307.1fF/mp=1.--.

Column 17, Line 38 change "10/12/706.6fF/mp=1, 6.9/6/247.5F/mp=1," to --10/12/706.6fF/mp=1, 5.9/10.2/357.9fF/mp=1, 6.9/6/247.5/F/mp=1,--.

Column 17, Lines 38-39 change "6.9/6/247.5fF/mp=1" to --6.9/6/247.5F/mp=1--.

Column 18, Line 56 change "("B SGA") 10 may be" to --("BSGA") 10 may be--.